(12) United States Patent
Yonezawa et al.

(10) Patent No.: US 7,351,605 B2
(45) Date of Patent: *Apr. 1, 2008

(54) METHOD OF MANUFACTURING A SEMICONDUCTOR DEVICE

(75) Inventors: Masato Yonezawa, Kanagawa (JP); Hajime Kimura, Kanagawa (JP); Yu Yamazaki, Tokyo (JP); Jun Koyama, Kanagawa (JP); Yasuko Watanabe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 170 days.

This patent is subject to a terminal disclaimer.

(21) Appl. No.: 10/994,390

(22) Filed: Nov. 23, 2004

(65) Prior Publication Data

US 2005/0093037 A1    May 5, 2005

Related U.S. Application Data

(63) Continuation of application No. 10/755,128, filed on Feb. 11, 2004, now Pat. No. 6,825,492, which is a continuation of application No. 10/117,345, filed on Apr. 8, 2002, now Pat. No. 6,692,984.

(30) Foreign Application Priority Data

Apr. 9, 2001   (JP)   .............................. 2001-109559

(51) Int. Cl.
     *H01L 21/00*    (2006.01)
(52) U.S. Cl. ............................ 438/96; 438/48; 438/57; 438/59; 438/97
(58) Field of Classification Search .................. 438/96, 438/48, 57, 59, 97
See application file for complete search history.

(56) References Cited

U.S. PATENT DOCUMENTS

| | | | |
|---|---|---|---|
| 5,262,654 | A | 11/1993 | Yamazaki |
| 5,627,364 | A | 5/1997 | Codama et al. |
| 6,023,257 | A | 2/2000 | Koyama |
| 6,082,865 | A | 7/2000 | Yamazaki |
| 6,087,648 | A | 7/2000 | Zhang et al. |
| 6,194,740 | B1 | 2/2001 | Zhang et al. |
| 6,236,063 | B1 | 5/2001 | Yamazaki et al. |
| 6,243,155 | B1 | 6/2001 | Zhang et al. |
| 6,255,705 | B1 | 7/2001 | Zhang et al. |

(Continued)

*Primary Examiner*—Long Pham
(74) *Attorney, Agent, or Firm*—Fish & Richardson P.C.

(57) ABSTRACT

The number of masks is reduced in a method of manufacturing a semiconductor device that has a transistor and a photoelectric conversion element on an insulating surface. In a manufacturing method of the present invention, semiconductor layers functioning as a source region, a drain region, and a channel formation region of a transistor are formed at the same time an n type semiconductor layer and p type semiconductor layer of a photoelectric conversion element are formed. Connection wiring lines to be electrically connected to the n type semiconductor layer and p type semiconductor layer of the photoelectric conversion element are formed at the same time a source wiring line and a drain wiring line of a transistor are formed. In a doping step using an impurity element that gives one conductivity type, a semiconductor layer of an n-channel transistor and the n type semiconductor layer of the photoelectric conversion element are simultaneously doped with the impurity element and a semiconductor layer of a p-channel transistor and the p type semiconductor layer of the photoelectric conversion element are simultaneously doped with the impurity element.

9 Claims, 25 Drawing Sheets

U.S. PATENT DOCUMENTS

| | | |
|---|---|---|
| 6,274,861 B1 | 8/2001 | Zhang et al. |
| 6,287,888 B1 | 9/2001 | Sakakura et al. |
| 6,288,388 B1 | 9/2001 | Zhang et al. |
| 6,692,984 B2 * | 2/2004 | Yonezawa et al. ............ 438/96 |
| 6,825,492 B2 * | 11/2004 | Yonezawa et al. ............ 257/53 |
| 2001/0000676 A1 | 5/2001 | Zhang et al. |
| 2001/0019130 A1 | 9/2001 | Yamazaki et al. |
| 2001/0030279 A1 | 10/2001 | Zhang et al. |
| 2001/0030704 A1 | 10/2001 | Kimura |
| 2001/0031074 A1 | 10/2001 | Yamazaki et al. |
| 2001/0038065 A1 | 11/2001 | Kimura |
| 2002/0000631 A1 | 1/2002 | Sakakura et al. |
| 2002/0011972 A1 | 1/2002 | Yamazaki et al. |
| 2002/0011978 A1 | 1/2002 | Yamazaki et al. |
| 2002/0012057 A1 | 1/2002 | Kimura |
| 2002/0027229 A1 | 3/2002 | Yamazaki et al. |
| 2002/0044208 A1 | 4/2002 | Yamazaki et al. |

* cited by examiner

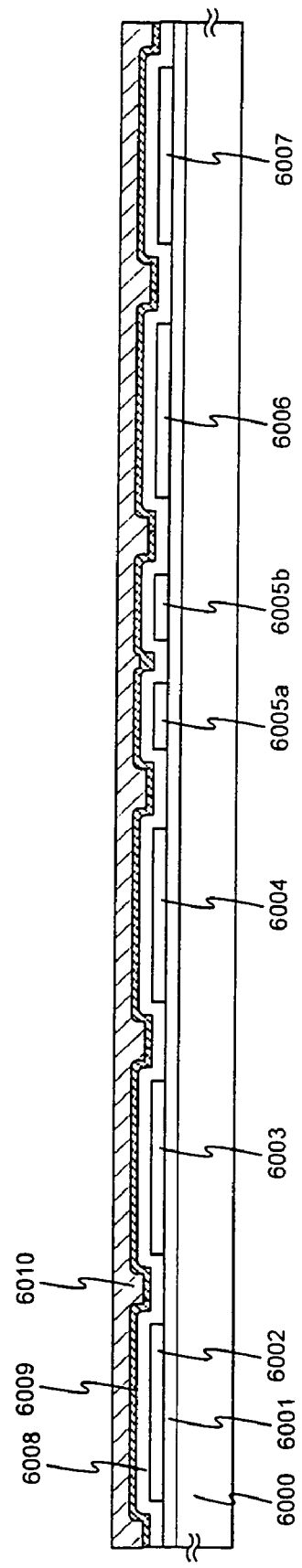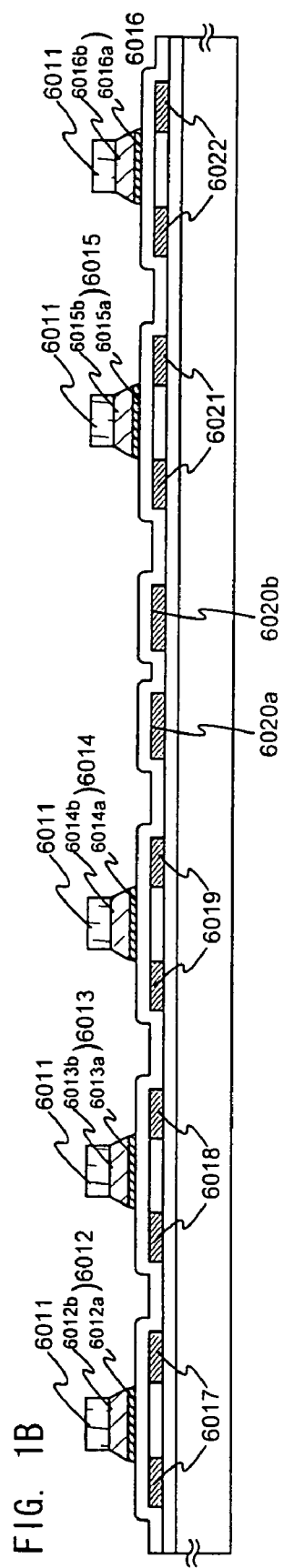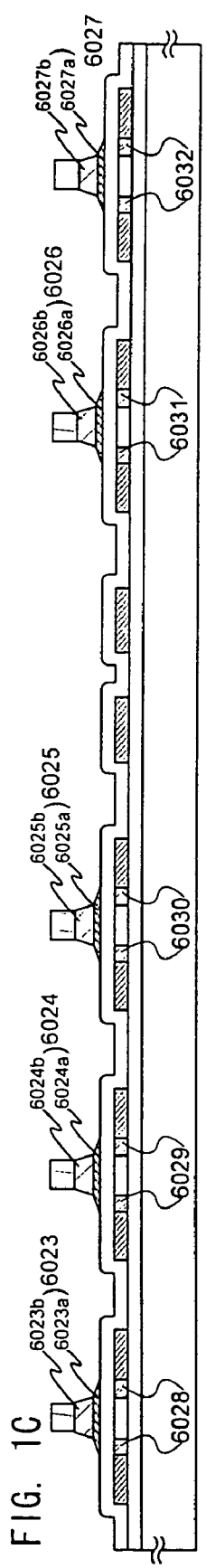

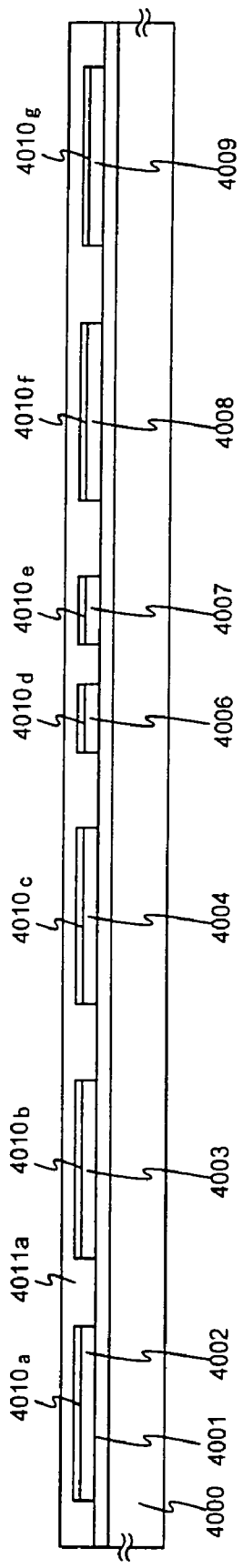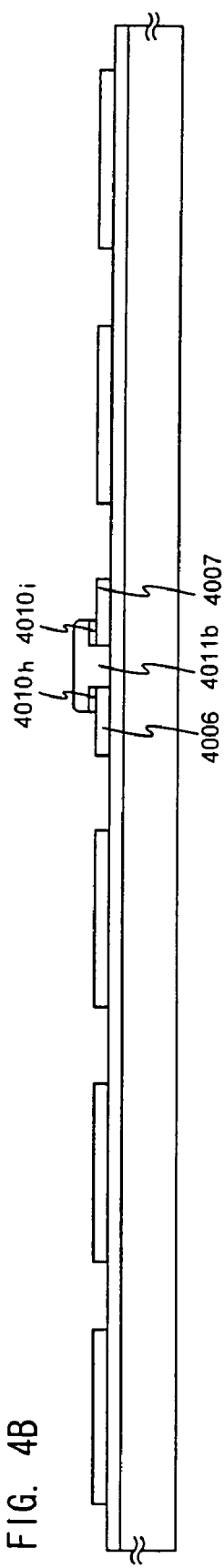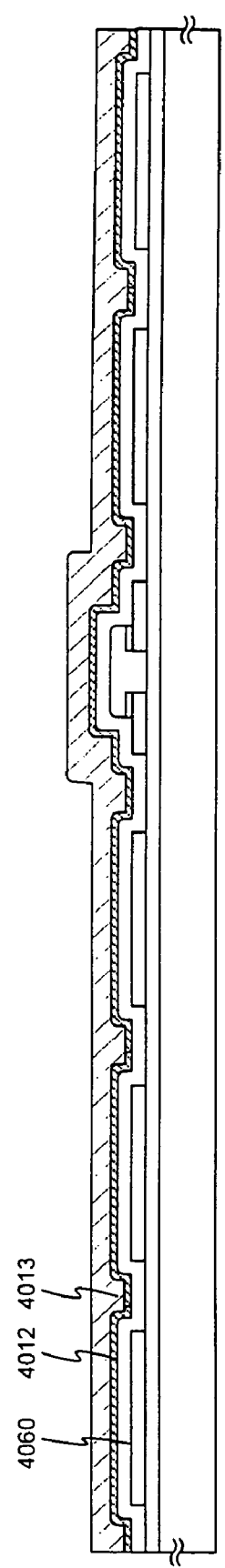

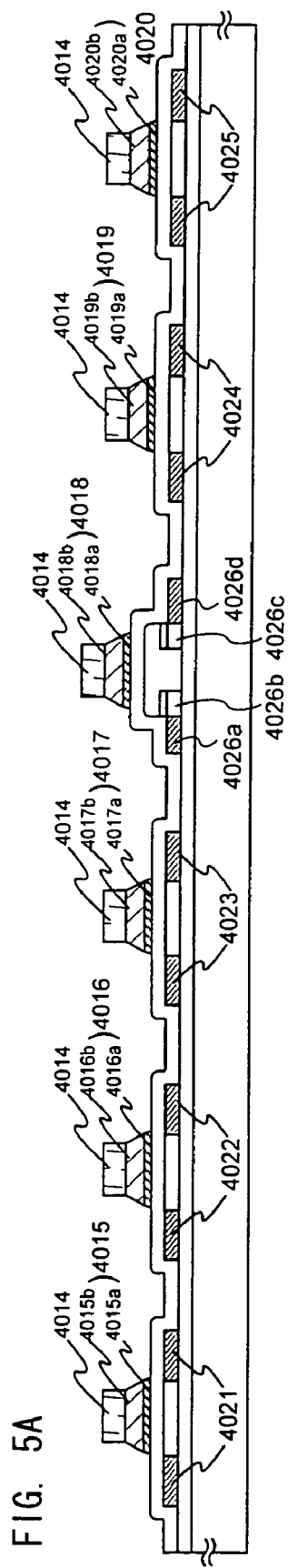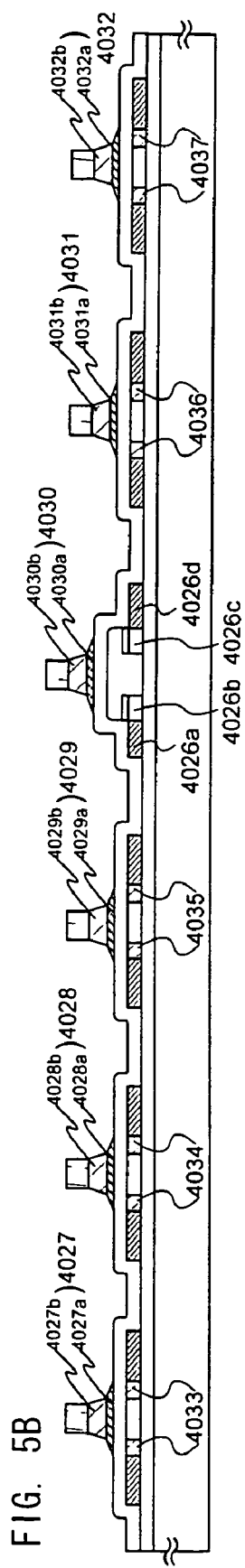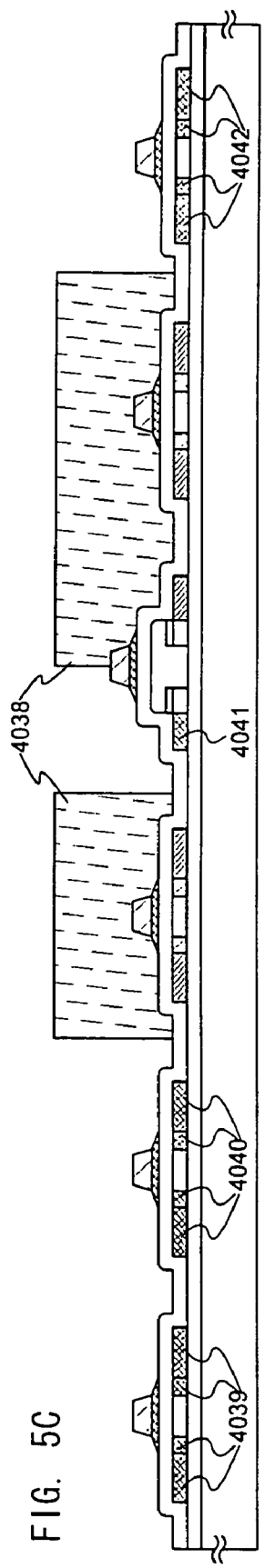

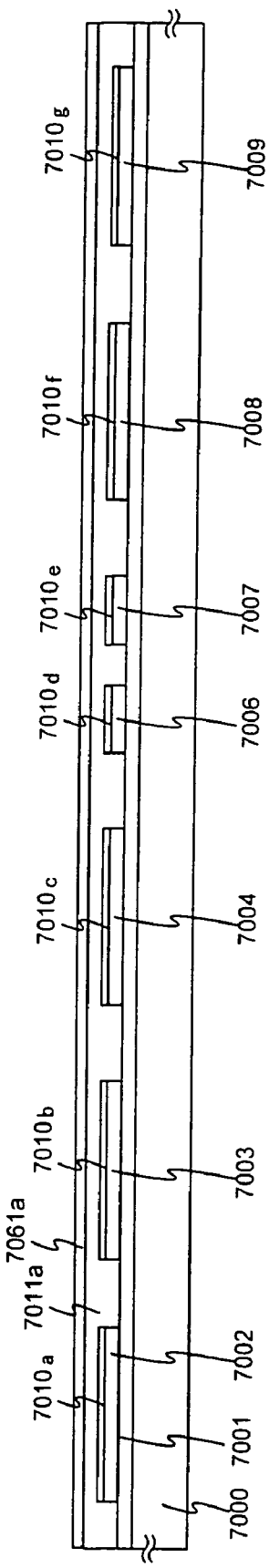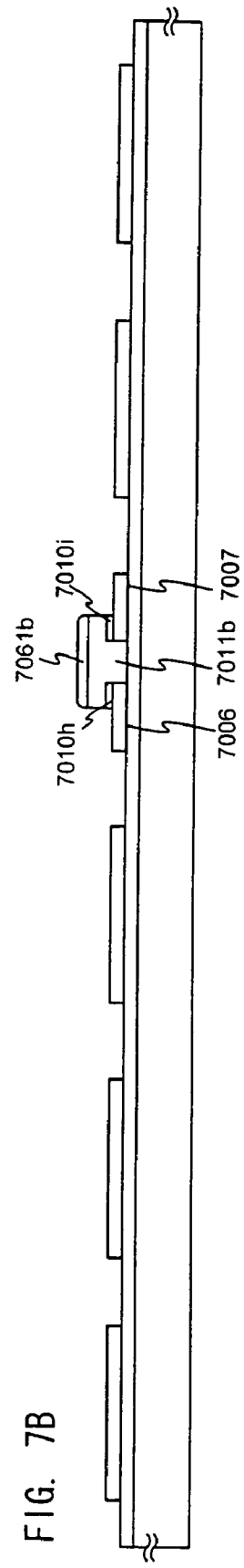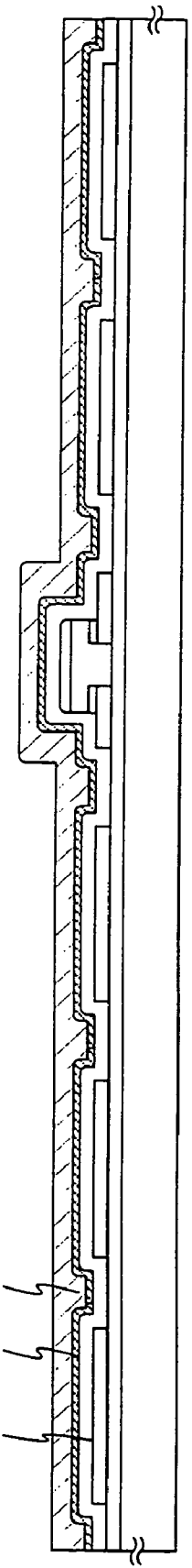

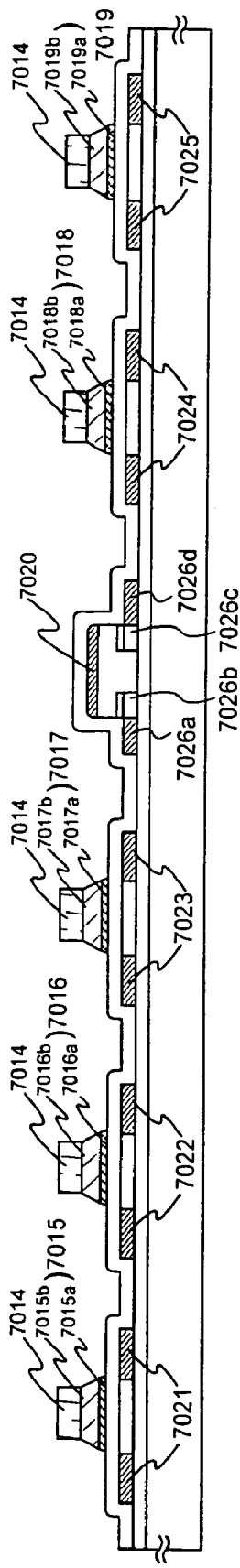
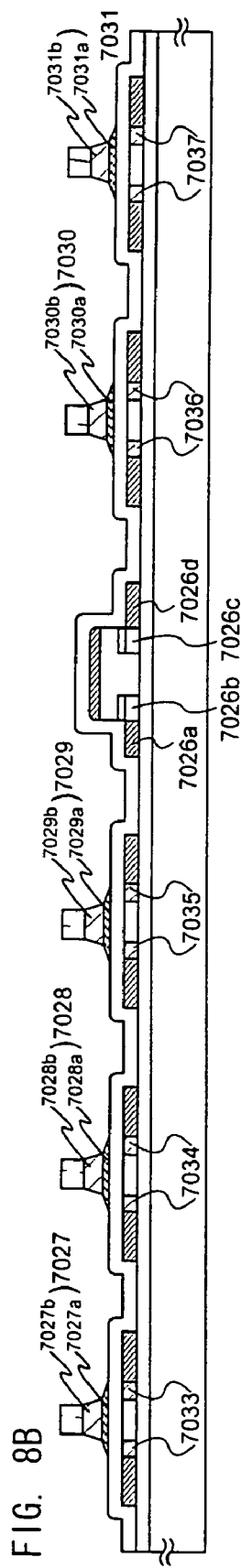
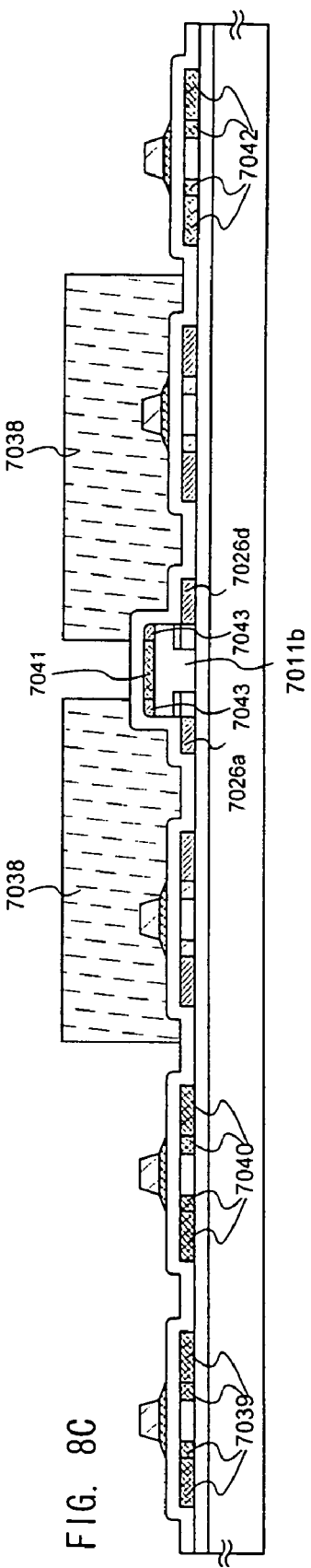

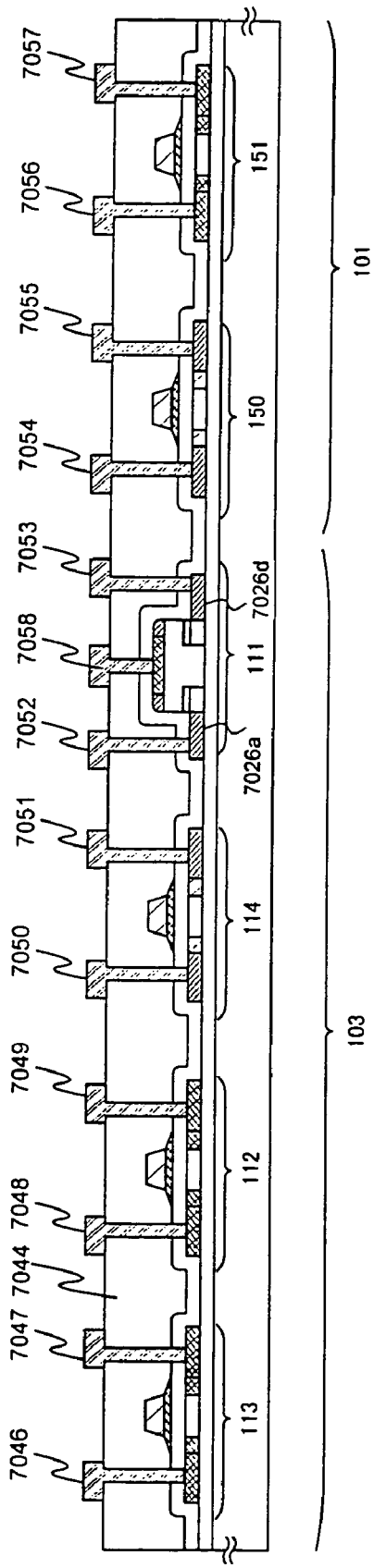
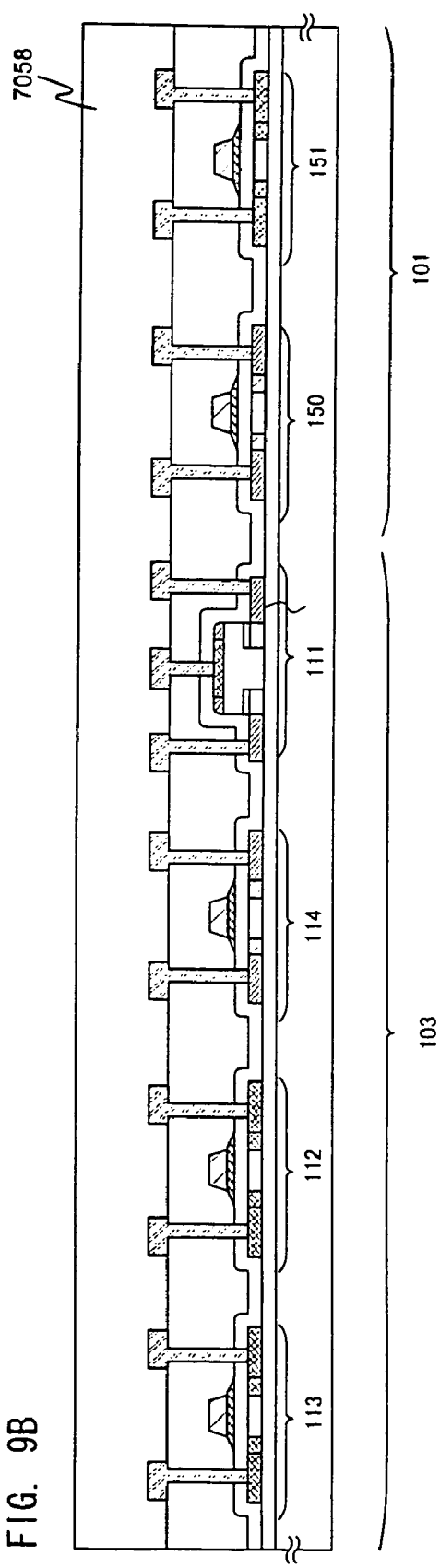

METHOD OF MANUFACTURING A SEMICONDUCTOR DEVICE

CROSS-REFERENCE TO RELATED APPLICATIONS

This application is a continuation application of U.S. application Ser. No. 10/775,128 filed Feb. 11, 2004, now U.S. Pat. No. 6,825,492 now allowed, which is a continuation of U.S. application Ser. No. 10/117,345, filed Apr. 8, 2002, now U.S. Pat. No. 6,692,984, which claims the benefit of a foreign priority application filed in Japan as Serial No. 2001-109559 on Apr. 9, 2001. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a semiconductor device having an image sensor function and to a method of manufacturing the same. More specifically, the present invention relates to a semiconductor device in which a photoelectric conversion element and a transistor are formed on an insulating surface and to a method of manufacturing the same.

Note that, in this specification, the term semiconductor device generally refers to devices hat utilize semiconductor characteristics to function, and includes as a category electrooptical devices, semiconductor circuits, and electronic equipment.

2. Description of the Related Art

In recent years, various kinds of sensors have been developed and put into practical use with accompanying technology advancement thereof. One type of those sensors are semiconductor devices having an image sensor function, which are used to capture text and image information on paper or the like into personal computers.

Examples of this type of semiconductor devices include digital still cameras, scanners, and copying machines. Digital still cameras are used as replacements for conventional silver film cameras, and have area sensors in which pixels are arranged two-dimensionally. Scanners and copying machines are used as means for reading text and image information on paper, and have line sensors in which pixels are arranged one-dimensionally.

A semiconductor device having an image sensor function is provided with a pixel portion that has a plurality of pixels. Each of the pixels has a photoelectric conversion element and one or a plurality of transistors selected from a transistor that functions as a switching element of the photoelectric conversion element, a transistor for amplifying a signal of the photoelectric conversion element, and a transistor for erasing a signal of the photoelectric conversion element.

A photoelectric conversion element often used is a PIN photodiode. Also used are a PN photodiode, an avalanche diode, an npn embedded diode, a Schottky diode, and a phototransistor. An x-ray photoconductor and an infrared sensor are also photoelectric conversion elements.

Semiconductor devices having an image sensor function are roughly divided into CCD type and CMOS type. CMOS type semiconductor devices are further classified into passive semiconductor devices to which amplifying transistors are not mounted and active semiconductor devices to which amplifying transistors are mounted. An amplifying transistor has a function of amplifying an image signal of a subject read by a photoelectric conversion element.

An active semiconductor device has, in addition to an amplifying transistor as above, a sensor selecting transistor and the like. Accordingly, the number of elements in one pixel in an active semiconductor device is larger than in a passive semiconductor device.

When manufacturing the semiconductor devices described above, a transistor is formed first on an insulating surface and then a photoelectric conversion element is formed. The photoelectric conversion element is often a PIN junction element obtained by layering three thin films. Accordingly, manufacture of a semiconductor device having a photoelectric conversion element and a transistor requires at least three masks for forming a p type semiconductor layer, a photoelectric conversion layer, and an n type semiconductor layer, in addition to the number of masks for forming the transistor.

In manufacture of a semiconductor device that has a transistor and a photoelectric conversion element on an insulating surface, the manufacturing process is complicated and has a large number of steps. An increase in number of steps leads to increased manufacturing cost as well as reduction in manufacture yield.

When three additional masks are required for forming a p type semiconductor layer, a photoelectric conversion layer, and an n type semiconductor layer, in addition to the number of the masks for forming a transistor on an insulating surface, the manufacturing process of the semiconductor device becomes laborious and the yield could be greatly reduced since lowering in yield in each step is multiplied in the final yield. Furthermore, the additional masks prolong manufacture time and therefore increase manufacturing cost.

Manufacture of the semiconductor device employs the photolithography technique. The photolithography technique uses a photo mask to form on a substrate a photoresist pattern that serves as a mask in an etching step. The introduction of one photo mask involves addition of various steps such as formation of a coat, etching of the coat, resist peeling, washing, and drying in the resist application step, pre-bake step, exposure step, development step, and post-bake step, and in the preceding and following steps thereof. The additional steps make the manufacture of the semiconductor device even more laborious. Reducing steps in number can be an effective measure in improving the productivity and yield. However, manufacturing cost can be reduced only to a limited degree unless the number of photo masks is reduced.

SUMMARY OF THE INVENTION

The present invention has been made in view of the circumstances described above, and an object of the present invention is therefore to reduce the number of masks for forming a photoelectric conversion element, which is added to the number of masks necessary for forming a transistor only, in a method of manufacturing a semiconductor device having a transistor and a photoelectric conversion element formed on an insulating surface. Another object of the present invention is to simplify a semiconductor device manufacturing process, improve the yield, and to reduce a manufacturing cost of a semiconductor device by reducing the number of masks. Still another object of the present invention is to provide a semiconductor device manufactured in accordance with the above method of manufacturing a semiconductor device.

The present inventors have devised three major manufacturing methods as means for attaining the above objects. Descriptions of the methods are given below. A photoelectric conversion element in this specification is a PIN junction element that has a p type semiconductor layer, a photoelectric conversion layer (i layer), and an n type semiconductor layer.

According to a first aspect of the present invention, there is provide a method of manufacturing a semiconductor device, characterized by comprising the steps of: forming a semiconductor on an insulating surface; forming a first insulating film on the semiconductor; forming a gate electrode on the first insulating film that is in contact with the semiconductor; doping the semiconductor with an impurity element that gives one conductivity type to form a first impurity region: using a mask formed on the semiconductor to dope the semiconductor with an impurity element that gives the other conductivity type (opposite to the one conductivity type) and form a second impurity region; forming a second insulating film on the first and second impurity regions; forming contact holes in the second insulating film so that the contact holes reach the first and second impurity regions; forming a metal film so as to cover the contact holes; forming from the metal film wiring lines that are connected to the first and second impurity regions, and then removing a part of the metal film that is in contact with a photoelectric conversion layer that later makes a photoelectric conversion element; and forming an amorphous semiconductor to be brought into contact with the first and second impurity regions where the metal film is removed.

According to a second aspect of the present invention, there is provided a method of manufacturing a semiconductor device, characterized by comprising the steps of: forming a first semiconductor on an insulating surface; forming a first insulating film on the first semiconductor; patterning the first semiconductor and the first insulating film to form a second semiconductor and a second insulating film at the same time; forming a third semiconductor on the second insulating film; patterning the third semiconductor while using the second insulating film as an etching stopper to form a fourth semiconductor; forming a third insulating film on the second and fourth semiconductors; forming a gate electrode only on the third insulating film that is in contact with the second and fourth semiconductors; doping the second and fourth semiconductors with an impurity element that gives one conductivity type to form first impurity regions; and using a mask formed on the second and fourth semiconductors to dope the second and fourth semiconductors with an impurity element that gives the other conductivity type (opposite to the one conductivity type) and form second impurity regions.

According to a third aspect of the present invention, there is provided a method of manufacturing a semiconductor device, characterized by comprising the steps of: forming a first semiconductor on an insulating surface; forming a first insulating film on the first semiconductor; patterning the first semiconductor and the first insulating film to form a second semiconductor and a second insulating film at the same time; forming a third semiconductor on the second insulating film; forming a fourth semiconductor on the third semiconductor; patterning the third and fourth semiconductors at once while using the second insulating film as an etching stopper to form fifth and sixth semiconductors; forming a third insulating film on the second, fifth, and sixth semiconductors; forming a gate electrode only on the third insulating film that is in contact with the second semiconductor; doping the second and sixth semiconductors with an impurity element that gives one conductivity type to form first impurity regions; and using a mask formed on the second, fifth, and sixth semiconductors to dope the second and sixth semiconductors with an impurity element that gives the other conductivity type (opposite to the one conductivity type) and form second impurity regions.

In a manufacturing method of the present invention, semiconductor layers functioning as a source region, a drain region, and a channel formation region of a transistor are formed at the same time an n type semiconductor layer and p type semiconductor layer of a photoelectric conversion element are formed. Connection wiring lines to be electrically connected to the n type semiconductor layer and the p type semiconductor layer of the photoelectric conversion element are formed at the same time a source wiring line and a drain wiring line of a transistor are formed. In a step of doping an impurity element that gives one conductivity type, a semiconductor layer of an n-channel transistor and the n type semiconductor layer of the photoelectric conversion element are simultaneously doped with the impurity element and a semiconductor layer of a p-channel transistor and the p type semiconductor layer of the photoelectric conversion element are simultaneously doped with the impurity element.

Masks used in the method of manufacturing a semiconductor device of the present invention can be reduced in number by employing the above manufacturing process. According to the present invention, the number of masks used in a semiconductor device manufacturing process including formation of a photoelectric conversion element and a transistor on an insulating surface can be reduced and therefore the manufacturing process is simplified. As a result, the manufacture yield is improved and manufacturing cost is reduced.

In the following description of preferred embodiments, the first manufacturing method, the second manufacturing method, and the third manufacturing method are described in detail in Embodiment Mode 1, Embodiment Mode 2, and Embodiment Mode 3, respectively.

BRIEF DESCRIPTION OF THE DRAWINGS

In the accompanying drawings:

FIGS. 1A to 1C are diagrams showing a process of manufacturing a semiconductor device of the present invention;

FIGS. 4A to 4C are diagrams showing a process of manufacturing a semiconductor device of the present invention;

FIGS. 5A to 5C are diagrams showing a process of manufacturing a semiconductor device of the present invention;

FIGS. 7A to 7C are diagrams showing a process of manufacturing a semiconductor device of the present invention;

FIGS. 8A to 8C are diagrams showing a process of manufacturing a semiconductor device of the present invention;

FIGS. 9A and 9B are diagrams showing a process of manufacturing a semiconductor device of the present invention;

DETAILED DESCRIPTION OF THE PREFERRED EMBODIMENTS

Embodiment Mode 1

This embodiment mode describes in detail a method of simultaneously forming a photoelectric conversion element and transistors of a pixel portion in a semiconductor device and transistors of a driving circuit portion (a source signal line driving circuit and a gate signal line driving circuit) that is placed in the periphery of the pixel portion.

Figure 10:
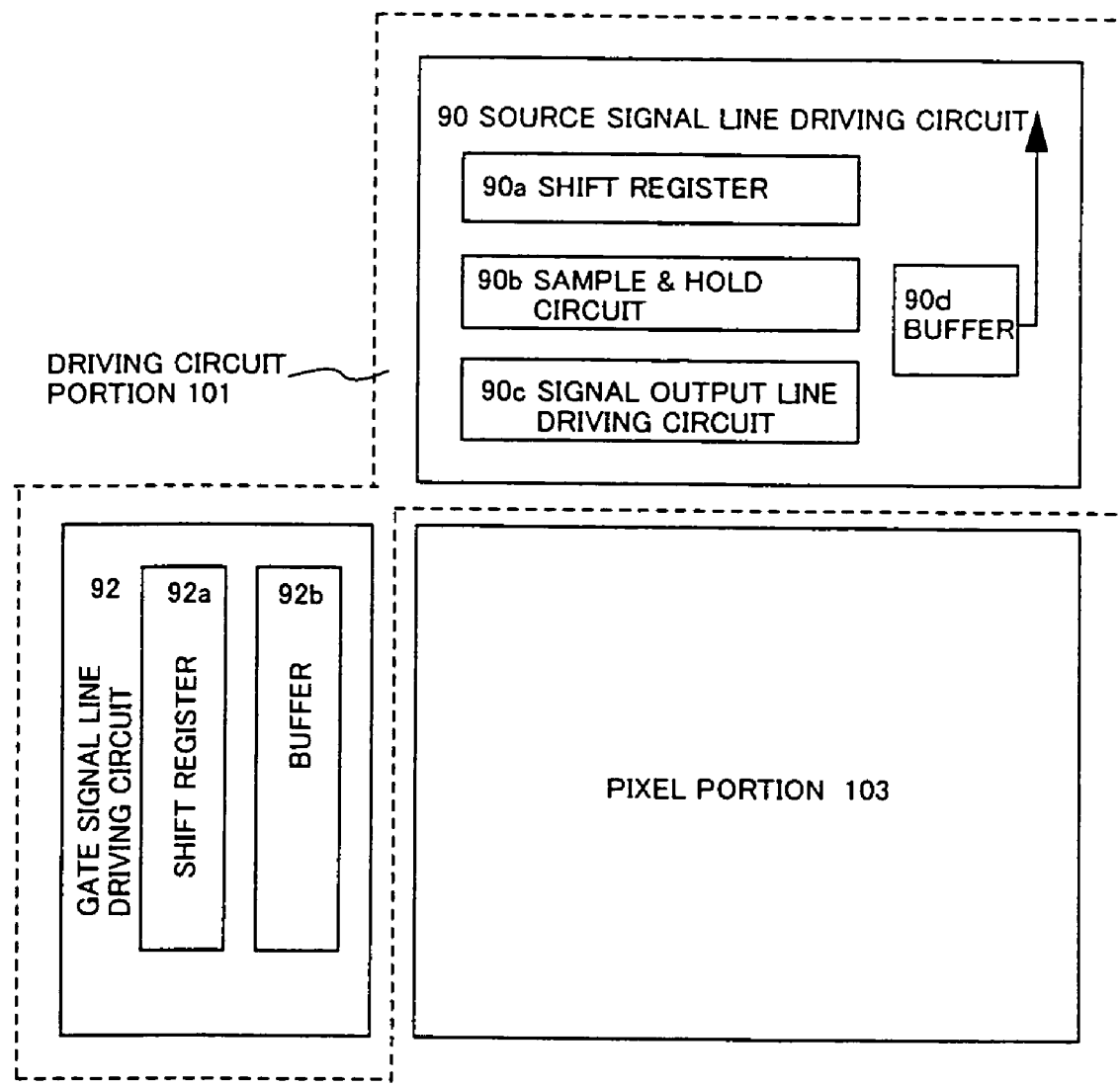
FIG. 10 is a block diagram of a semiconductor device to which the present invention is applied.
Figure 12:
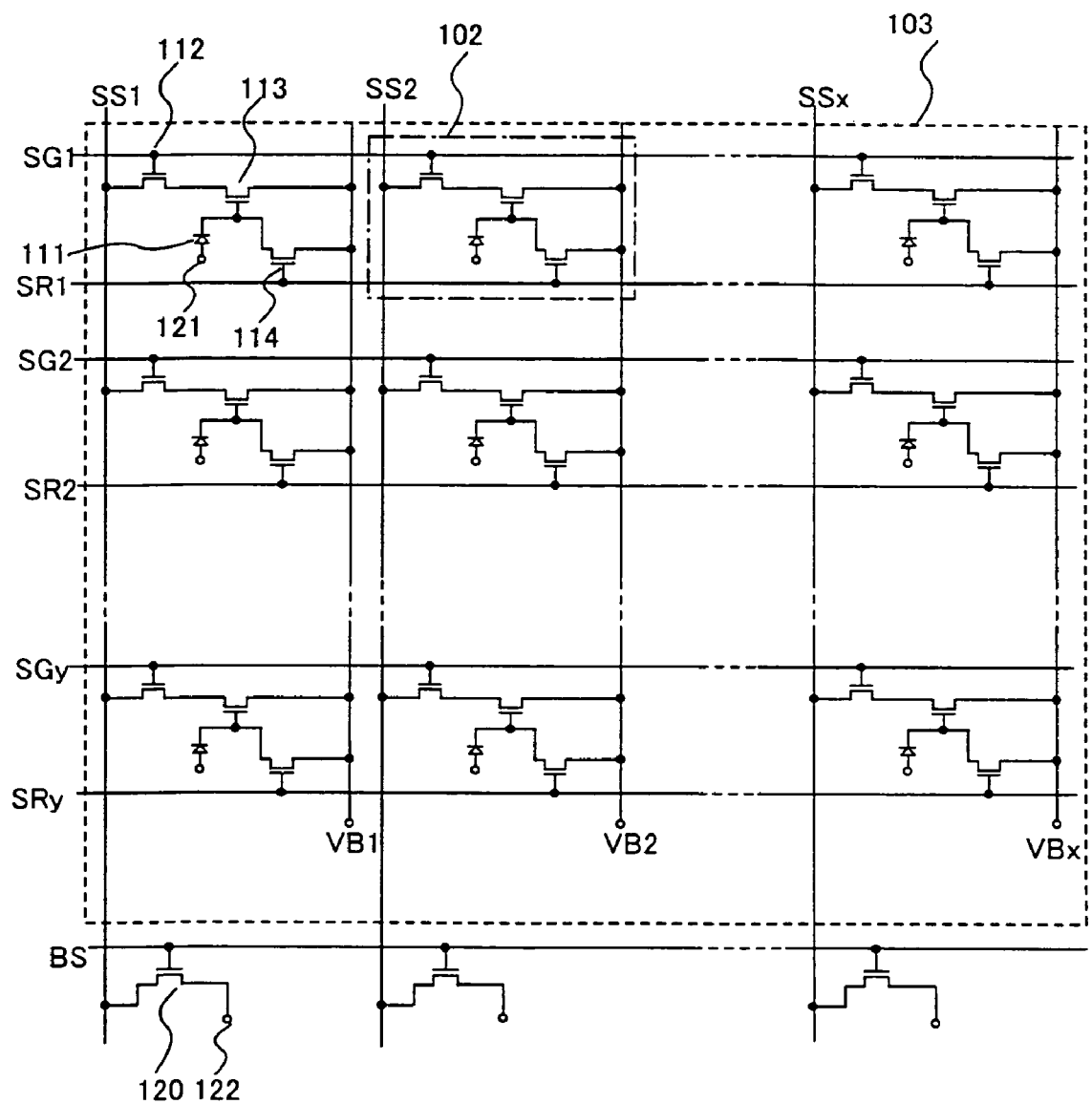
FIG. 12 is a diagram showing a pixel portion of a semiconductor device of the present invention.

As shown in FIG. 10, a source signal line driving circuit 90 and a gate signal line driving circuit 92 are collectively called a driving circuit portion 101 in this specification. The driving circuit portion 101 in this embodiment mode is a CMOS circuit that is a basic unit. In the semiconductor device described in this embodiment mode, a pixel 102 of a pixel portion 103 has a photoelectric conversion element 111, an amplifying transistor 113, a selecting transistor 112, and a resetting transistor 114 as shown in FIG. 12.

Reference is made to FIG. 1A. A substrate 6000 in this embodiment mode is formed of glass such as barium borosilicate glass and alumino borosilicate glass typical example of which are Coming #7059 glass and #1737 glass (products of Coming Incorporated). The substrate 6000 is not limited as long as the substrate has light transmission property, and may be a quartz substrate. A plastic substrate may also be used if it has a heat resistance that can withstand the treatment temperature of this embodiment mode.

A base insulating film 6001 is formed next. The base insulating film 6001 is an insulating film containing silicon (for example, a silicon oxide film, a silicon oxynitride film, or a silicon nitride film) and formed by plasma CVD or sputtering. In this embodiment mode, a silicon oxynitride film with a film thickness of 150 nm is used.

As shown in FIG. 1A, an amorphous semiconductor film is formed on the base insulating film 6001 to a film thickness of 30 to 60 nm. Then the amorphous semiconductor film is subjected to known crystallization treatment (laser crystallization, thermal crystallization, or thermal crystallization that uses Ni or other catalysts) to obtain a crystalline semiconductor film. The crystalline semiconductor film is patterned into desired shapes to form island-like semiconductor layers 6002 to 6004, 6005a, 6005b, 6006, and 6007.

In this embodiment mode, an amorphous semiconductor film is formed by plasma CVD to a film thickness of 54 nm and then a solution containing Ni is held to the surface of the amorphous silicon. After dehydrating the amorphous semiconductor film (at 500° C. for an hour), the amorphous semiconductor film is subjected to thermal crystallization (at 550° C. for four hours) and then to laser annealing treatment for improving the crystallinity to obtain a crystalline semiconductor film. The semiconductor film may be doped with an impurity element that gives the p type conductivity in order to control the threshold voltage ($V_{th}$) of an n-channel transistor. Known as an impurity element that gives the p type conductivity is a Group 13 element in the periodic table, such as boron (B), aluminum (Al), and gallium (Ga). The crystalline semiconductor film in this embodiment mode is then patterned to form the island-like semiconductor layers 6002 to 6004, 6005a, 6005b, 6006, and 6007.

The island-like semiconductor layers 6002 to 6004, 6005a, 6005b, 6006, and 6007 are covered with a gate insulating film 6008. The gate insulating film 6008 is an insulating film containing silicon and is formed by plasma CVD or sputtering to a film thickness of 40 to 160 nm. The gate insulating film 6008 is either a single layer or a laminate of insulating films containing silicon.

Layered on the gate insulating film 6008 are a first conductive film (TaN film) 6009 with a film thickness of 20 to 100 nm and a second conductive film (W film) 6010 with a film thickness of 100 to 400 nm. The first conductive film 6009 and the second conductive film 6010 are formed of elements selected from the group consisting of Ta, W, Ti, Mo, Al, and Cu, or formed of alloy materials or compound materials mainly containing the elements listed in the above. A semiconductor film doped with an impurity element, typically a silicon film doped with phosphorus (P) (pSi film), may be used instead.

In this embodiment mode, the first conductive film 6009 is a TaN film with a film thickness of 30 nm and the second conductive film 6010 is a W film with a film thickness of 370 nm. The TaN film is formed by sputtering with Ta as the target in an atmosphere containing nitrogen. The W film is formed by sputtering with W as the target. Alternatively, the W film can be obtained by thermal CVD using tungsten hexafluoride ($WF_6$). Whichever method is employed, the W film has to have a low resistivity, desirably, 20 μΩ cm or less, in order to use the W film as a gate electrode. The resistivity of the W film can be lowered by increasing the grain size. However, if there are too many impurity elements such as oxygen in the W film, crystallization is hindered to raise the resistivity. This embodiment mode achieves a resistivity of 9 to 20 μΩ cm by employing sputtering with W of high purity (99.9999%) as the target and by taking a great care not to allow an impurity from the air to mix in in forming the W film.

Next, as shown in FIG. 1B, photolithography is used to form a resist mask 6011 and the first etching treatment is conducted to form electrodes and wiring lines. The first etching treatment is conducted under first and second etching conditions. The first etching conditions in this embodiment mode include using ICP (inductively coupled plasma) etching, employing as etching gas $CF_4$, $Cl_2$, and $O_2$, setting the gas flow rate ratio thereof to 25:25:10 (sccm), and giving an RF (13.66 MHz) power of 500 W to a coiled electrode at a pressure of 1.0 Pa to generate plasma. Examples of the etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$. The substrate side (sample stage) also receives an RF (13.66 MHz) power of 160 W to apply substantially negative self-bias voltage. Under the first etching conditions, the W film is etched to taper the edges of the first conductive layers.

Without removing the resist mask 6011, the etching conditions are switched to the second etching conditions. $CF_4$ and $Cl_2$ are used as etching gas, the gas flow rate ratio thereof is set to 30:30 (sccm), and an RF (13.66 MHz) power of 500 W is given to a coiled electrode at a pressure of 1 Pa to generate plasma for 30 second etching. The substrate side (sample stage) also receives an RF (13.66 MHz) power of 20 W to apply substantially negative self-bias voltage. Under the second etching conditions that include the use of mixture gas of $CF_4$ and $Cl_2$, the W film and the TaN film are etched to about the same degree. The rate of etching the W film is 68.97 nm/min. and the rate of etching the TaN film is 66.43 nm/min. under the second etching conditions. In order to etch the films without leaving any residue on the gate insulating film 6008, the etching time is preferably prolonged by about 10 to 20%.

Without removing the resist mask 6011, the first doping treatment is conducted to dope the island-like semiconductor layers 6002 to 6004, 6005a, 6005b, 6006, and 6007 with an impurity element that gives the n type conductivity. The doping treatment employs ion doping or ion implantation. In this case, the first shape conductive layers 6012 to 6016 serve as masks against the impurity element and first impurity regions 6017 to 6019, 6020a, 6020b, 6021, and 6022 are formed in a self-aligning manner.

Without removing the resist mask 6011, second etching treatment is conducted as shown in FIG. 1C. The second etching treatment employs third and fourth etching conditions. The third etching conditions in this embodiment mode include employing as etching gas $CF_4$ and $Cl_2$, setting the gas flow rate ratio thereof to 30:30 (sccm), and giving an RF (13.46 MHz) power of 500 W to a coiled electrode at a pressure of 1.0 Pa to generate plasma for 15 second etching. The substrate side (sample stage) also receives an RF (13.46 MHz) power of 10 W to apply substantially negative self-bias voltage. The rate of etching the W film is 227.3 nm/min. and the rate of etching the TaN film is 32.0 nm/min. in the second etching treatment. The selective ratio of W to TaN is 7.1, and the rate of etching the gate insulating film 6008 is 33.7 nm/min. in the second etching treatment. When $SF_6$ is used for the etching gas as in this example, the selective ratio with respect to the gate insulating film 6008 is high and reduction in thickness of the film can be avoided. The transistors of the driving circuit portion 101 have higher reliability when the widths of the tapered portions in the channel length direction are larger. Therefore it is effective to perform dry etching using etching gas that contains $SF_6$ in forming the tapered portions.

The fourth etching conditions may include employing as etching gas $CF_4$, $Cl_2$, and $O_2$. In this case, the gas flow rate ratio thereof is set to 20:20:20 (sccm), and an RF (13.46 MHz) power of 500 W is given to a coiled electrode at a pressure of 1.0 Pa to generate plasma for etching. The substrate side (sample stage) also receives an RF (13.46 MHz) power of 20 W to apply substantially negative self-bias voltage. When $CF_4$, $Cl_2$, and $O_2$ are used for the etching gas, the rate of etching the W film is 124.62 nm/min. and the rate of etching the TaN film is 20.67 nm/min. The selective ratio of W to TaN is 6.04. Therefore the W film is selectively etched. At this point, portions of the gate insulating film 6008 that are not covered with the first shape conductive layers 6012 to 6016 are etched and thinned (not shown in the drawings).

The second doping treatment is conducted next. In this doping treatment, the second conductive layers 6023b to 6027b are used as masks against an impurity element and the semiconductor layers are doped such that the impurity element reaches the semiconductor layers below the tapered portions of the first conductive layers. In this embodiment mode, the impurity element used is phosphorus (P), and doping conditions for plasma doping include setting the dose to $1.5 \times 10^{14}/cm^2$, the acceleration voltage to 90 keV, the ion current density to 0.5 $\mu A/cm^2$, and the gas flow rate to 30 sccm, and the use of phosphine gas diluted with hydrogen by 5.0%. In this way, low concentration impurity regions 6028 to 6032 are formed in a self-aligning manner to overlap the first conductive layers (FIG. 1C).

Figure 2A:
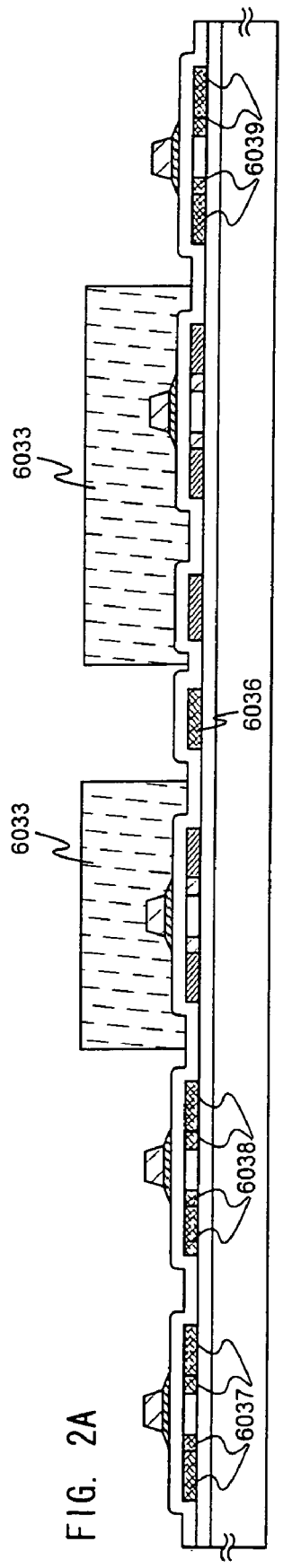
FIGS. 2A to 2C are diagrams showing a process of manufacturing a semiconductor device of the present invention.

The resist mask 6011 is then removed and the semiconductor layers that later serve as active layers of the n-channel transistors are covered with a resist mask 6033 in preparation of the third doping treatment. Through the third doping treatment, the semiconductor layers that serve as active layers of the p-channel transistors are doped with an impurity element that gives the other conductivity type (the opposite conductivity type (p type) to the one conductivity type (n type)). As a result, p type high concentration impurity regions 6036 to 6039 are formed in the doped semiconductor layers. The semiconductor layers are doped in the impurity element that gives the p type conductivity while using the first conductive layers 6023a to 6027a as masks against the impurity element to obtain the p type impurity regions. (FIG. 2A)

In this embodiment mode, the p type impurity regions 6036 to 6039 are formed by ion doping using diborane ($B_2H_6$). The impurity regions 6017, 6018, and 6022 and the impurity regions 6028, 6029, and 6032 are doped with phosphorus in different concentrations through the first doping treatment and the second doping treatment. Any of these regions has no trouble in functioning as a source region and a drain region of a p-channel transistor if it is doped with boron in a concentration of $2 \times 10^{20}$ to $2 \times 10^{21}/cm^3$.

A p-channel amplifying transistor 113, a p-channel selecting transistor 112, and an n-channel resetting transistor 114 are completed through the above steps. Also formed are an n-channel transistor 150 and a p-channel transistor 151. In the n-channel transistors in its polarity, low concentration impurity regions (LDD regions) that do not overlap the first conductive layers are formed.

Figure 2B:
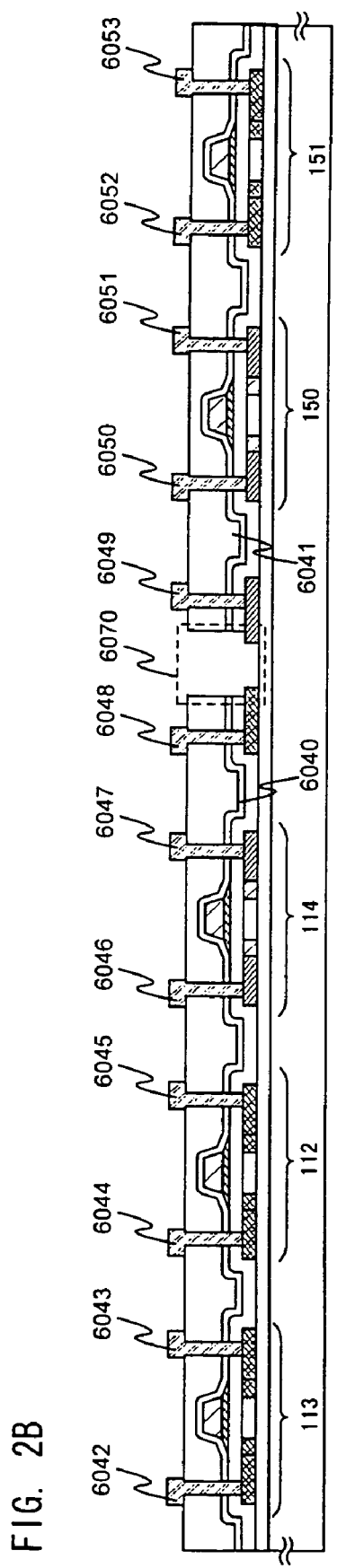

Next, the resist mask 6033 is removed and a first interlayer insulating film 6040 is formed as shown in FIG. 2B. The first interlayer insulating film 6040 is an insulating film containing silicon (for example, a silicon oxide film, a silicon oxynitride film, or a silicon nitride film) and formed by plasma CVD or sputtering to a film thickness of 10 to 200 nm. In this embodiment mode, a SiON film (silicon oxynitride film) is formed as the first interlayer insulating film 6040 by plasma CVD to a film thickness of 200 nm.

The next step is activation of the impurity elements used to dope the semiconductor layers. The activation step is achieved by thermal annealing using an annealing furnace. In thermal annealing, the substrate is heated in a nitrogen atmosphere with an oxygen concentration set to 1 ppm or less, preferably 0.1 ppm or less, at 400 to 700° C., typically 400 to 550° C. In the activation step of this embodiment mode, heat treatment is conducted at 550° C. for four hours. Other than thermal annealing, laser annealing, rapid thermal annealing (RTA), or the like can be employed in the activation step.

During the activation treatment in this embodiment mode, gettering is simultaneously achieved. Through the gettering, nickel used as a catalyst in crystallization is moved into impurity regions containing high concentration of phosphorus and the Ni concentration is reduced in the semiconductor layers for mainly forming channel formation regions. The channel formation regions with reduced nickel concentration lower the OFF current value and improve the crystallinity in transistors, and therefore provide high field effect mobility and excellent characteristics.

In this embodiment mode, gettering utilizes phosphorus contained in the source regions and the drain regions. Alternatively, gettering may be achieved through heat treatment that follows doping of other regions than the island-like semiconductor layers with P, Ar, or other inert gas before forming the island-like semiconductor layers. This method requires one additional mask but excellent gettering effect can be obtained.

The activation treatment may precede formation of the first interlayer insulating film 6040. However, if wiring line materials used are weak against heat, it is preferred to form the interlayer insulating film (insulating film mainly containing silicon, for example, a silicon nitride film) and then conduct the activation treatment as in this embodiment mode in order to protect the wiring lines, etc.

Next, the semiconductor layers are hydrogenated by heat treatment (at 300 to 660° C. for 1 to 12 hours). In this embodiment mode, the heat treatment is conducted in a 100% hydrogen atmosphere at 410° C. for four hours. This step is for terminating dangling bonds in the semiconductor layers. Other usable hydrogenation measures include plasma hydrogenation (which uses hydrogen excited by plasma).

If laser annealing is employed for the activation treatment, it is desirable to irradiate the semiconductor layers with laser light such as excimer laser and YAG laser after the above hydrogenation.

Next, a second interlayer insulating film 6041 is formed to a film thickness of 800 nm. The second interlayer insulating film 6041 is an insulating film containing silicon (for example, a silicon oxide film, a silicon oxynitride film, or a silicon nitride film) and formed by plasma CVD or sputtering to a film thickness of 10 to 2000 nm. In this embodiment mode, a SiON film (silicon oxynitride film) with a film thickness of 800 nm is formed as the second interlayer insulating film 6041 by plasma CVD.

Contact holes reaching the impurity regions 6019, 6020*b*, 6021, and 6036 to 6039 are formed next as shown in FIG. 2B. A metal film is formed on the contact holes. The metal film is formed of a compound mainly containing Al or Ag or a material similar to this compound. Then patterning follows for forming wiring lines 6042 to 6053 that are electrically connected to the impurity regions.

The wiring line 6048 and the wiring line 6049 are connected to the n type semiconductor layer 6020*b* of the photoelectric conversion element 111 and the p type semiconductor layer 6036 thereof, respectively. The wiring lines 6048 and 6049 are electrically connected to the source region or the drain region of one of the amplifying transistor 113, the selecting transistor 112, and the resetting transistor 114, or to power supply lines (VB1 to VBx) or other wiring lines. In the case of the semiconductor device shown in FIG. 12, the conductivities of the amplifying transistor 113, the selecting transistor 112, and the resetting transistor 114, the voltage applied to the power supply lines (VB1 to VBx), and the voltage applied to a power supply reference line 121 determine which of the three transistors is to be connected to the wiring line 6048 and the wiring line 6049 at its source region or drain region.

A part of the metal film that is formed on a contact hole 6070 reaching the impurity region 6020*b* and the impurity region 6036 is removed during the patterning so as to partially expose the impurity regions 6020*b* and 6036. (FIG. 2B)

An amorphous semiconductor film is formed to be brought into contact with the impurity region 6020*b* and the impurity region 6036 through the contact hole 6070. The amorphous semiconductor film is then patterned into desired shapes in a manner that brings the film into contact with the impurity region 6020*b* and the impurity region 6036. An amorphous semiconductor layer 6054 is thus obtained. (FIG. 2C)

Figure 2C:
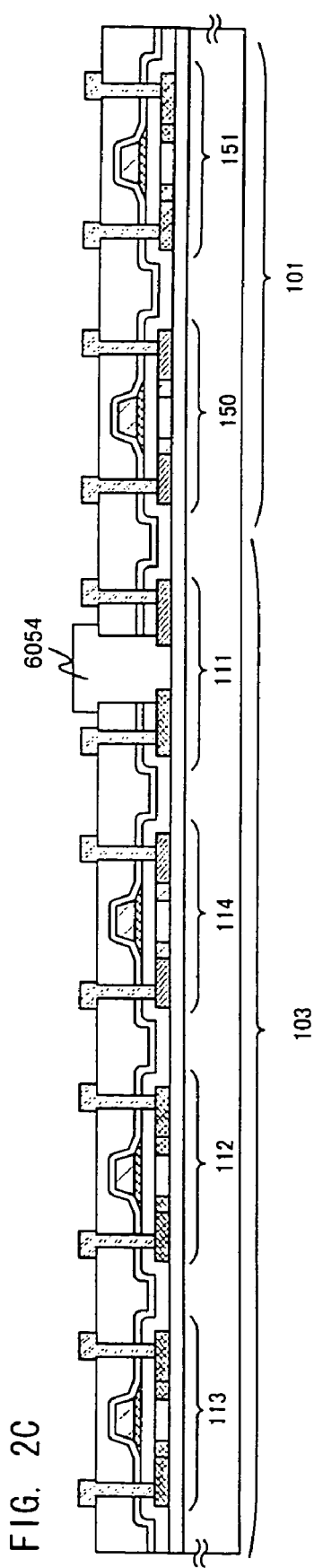

As shown in FIG. 2C, the impurity region 6020*b*, the impurity region 6036, and the amorphous semiconductor layer 6054 constitute the photoelectric conversion element 111. In this embodiment mode, the impurity region 6036 functions as the p type semiconductor layer, the amorphous semiconductor layer 6054 functions as the photoelectric conversion layer (i layer), and the impurity region 6020*b* functions as the n type semiconductor layer.

Figure 3:
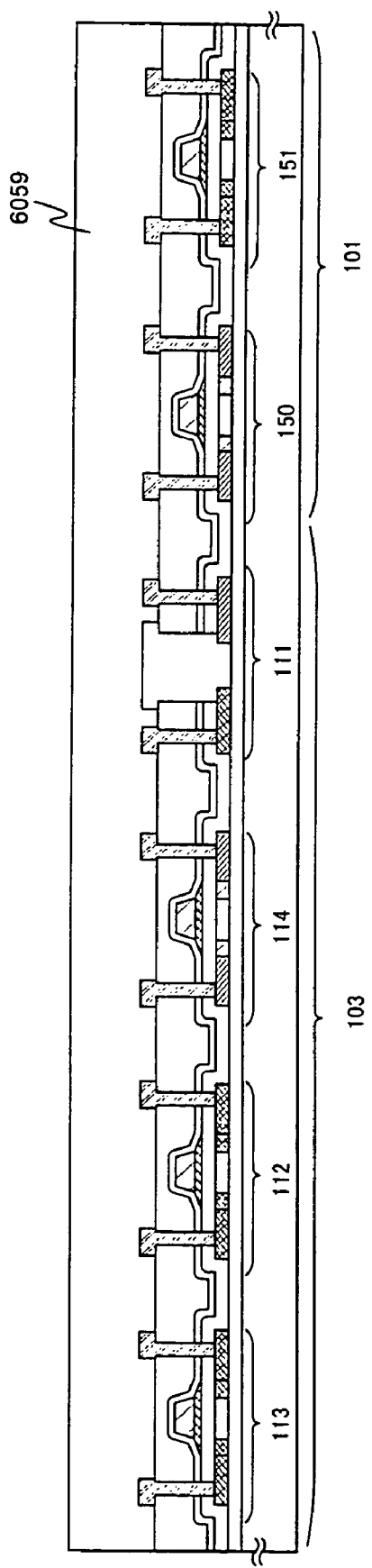
FIG. 3 is a diagram showing a process of manufacturing a semiconductor device of the present invention.

On the second interlayer insulating film 6040, an organic resin film is formed as a third interlayer insulating film 6059. The third interlayer insulating film 6059 functions as a planarization film to level the surface as well as insulates wiring line materials. The organic resin film in this embodiment mode is formed from acrylic to a film thickness of 670 nm. (FIG. 3)

The photoelectric conversion element 111 and the transistors for controlling the photoelectric conversion element 111 in the pixel portion 103 and the transistors of the driving circuit portion 101 can be formed on the same substrate through the above process.

The number of masks used in this embodiment mode is five necessary to form the transistors alone (a mask for forming the island-like semiconductor layers 6002 to 6007, the mask 6011 for forming the gate electrodes 6012 to 6016, the mask 6033 for forming the p type impurity regions, a mask for forming contact holes for the wiring lines 6042 to 6048 and 6060 to 6063, and a mask for forming the wiring lines 6042 to 6048 and 6060 to 6063) plus one (a mask necessary to form the amorphous semiconductor layer 6054 by patterning).

The resetting transistor 114 is an n-channel transistor and the amplifying transistor 113 and the selecting transistor 112 are p-channel transistors in this embodiment mode. Note that the present invention is not limited thereto and the transistors can have either polarity of the n type and p type. However, the polarity of the selecting transistor 112 is preferably reverse to the polarity of the resetting transistor 114.

Embodiment Mode 2

This embodiment mode describes in detail a method which is different from Embodiment Mode 1 of simultaneously forming a photoelectric conversion element and transistors of a pixel portion in a semiconductor device and transistors of a driving circuit portion (a source signal line driving circuit and a gate signal line driving circuit) that is placed in the periphery of the pixel portion.

As shown in FIG. 10, a source signal line driving circuit 90 and a gate signal line driving circuit 92 are collectively called a driving circuit portion 101 in this specification. The driving circuit portion 101 in this embodiment mode is a CMOS circuit that is a basic unit. In the semiconductor device described in this embodiment mode, a pixel 102 of a pixel portion 103 has a photoelectric conversion element 111, an amplifying transistor 113, a selecting transistor 112, and a resetting transistor 114 as shown in FIG. 12.

Reference is made to FIG. 4A. First, a substrate 4000 used in this embodiment mode is formed of glass such as barium borosilicate glass and alumino borosilicate glass typical example of which are Corning #7059 glass and #1737 glass (products of Corning Incorporated). The substrate 4000 can also be used if it has a heat resistance that can withstand the treatment temperature of this embodiment mode.

A base insulating film 4001 is formed next. The base insulating film 4001 is an insulating film containing silicon (for example, a silicon oxide film, a silicon oxynitride film, or a silicon nitride film) and formed by plasma CVD or sputtering. In this embodiment mode, a silicon oxynitride film with a film thickness of 150 nm is used.

Next, as shown in FIG. 4A, an amorphous semiconductor film is formed on the base insulating film 4001 to a film thickness of 30 to 60 nm. Then the amorphous semiconductor film is subjected to known crystallization treatment (laser crystallization, thermal crystallization, or thermal crystallization that uses Ni or other catalysts).

Note that, in this embodiment mode, an amorphous semiconductor film is formed by plasma CVD to a film thickness of 54 nm and then a solution containing Ni is held to the surface of the amorphous semiconductor film. After dehydrating the amorphous semiconductor film (at 500° C. for an hour), the amorphous semiconductor film is subjected to thermal crystallization (at 550° C. for four hours) and then to laser annealing treatment for improving the crystallinity to obtain a crystalline semiconductor film. The semiconductor film may be doped with an impurity element that gives the p type conductivity in order to control the threshold voltage ($V_{th}$) of an n-channel transistor. Known as an impurity element that gives the p type conductivity is a Group 13 element in the periodic table, such as boron (B), aluminum (Al), and gallium (Ga).

Next, an insulating film containing silicon (for example, a silicon oxide film, a silicon oxynitride film, or a silicon nitride film) is formed by plasma CVD or sputtering on the crystalline semiconductor film. The obtained crystalline semiconductor film and the insulating film that is formed on the amorphous semiconductor film are patterned into desired shapes to form island-like semiconductor layers 4002 to 4009 and insulating layers 4010a to 4010g.

An amorphous semiconductor film 4011a with a film thickness of 30 to 60 nm is formed to cover the insulating layers 4010a to 4010g.

As shown in FIG. 4B, the amorphous semiconductor film 4011a is patterned so as to come into contact with the semiconductor layers 4006 and 4007, thereby forming an amorphous semiconductor layer 4011b. The amorphous semiconductor layer 4011b later functions as a photoelectric conversion layer (i layer) of the photoelectric conversion element 111.

Of the insulating layers 4010a to 4010g, the insulating layers in the exposed regions (the insulating layers in the regions that are not covered with the amorphous semiconductor layer 4011b) are etched. At this point, portions of the insulating layers 4010d and 4010e that are not covered with the amorphous semiconductor layer 4011b are etched to become insulating layers 4010h and 4010i (FIG. 4B).

Then, the island-like semiconductor layers 4002 to 4009, and an amorphous semiconductor layer 4011b are covered with a gate insulating film 4060. The gate insulating film 4060 is an insulating film containing silicon and is formed by plasma CVD or sputtering to a film thickness of 40 to 140 nm. Here, the gate insulating film 4060 is either a single layer or a laminate of insulating films containing silicon.

Layered on the gate insulating film 4060 are a first conductive film (TaN film) 4012 with a film thickness of 20 to 100 nm and a second conductive film (W) 4013 with a film thickness of 100 to 400 nm. The first conductive film 4012 and the second conductive film 4013 may be formed of elements selected from the group consisting of Ta, W, Ti, Mo, Al, and Cu, or formed of alloy materials or compound materials mainly containing the elements listed in the above. A semiconductor film doped with an impurity element, typically a silicon film doped with phosphorus (P) (p-Si film), may be used instead.

In this embodiment mode, the first conductive film 4012 made from a TaN film with a film thickness of 30 nm and the second conductive film 4013 made from a W film with a film thickness of 370 nm are laminated. The TaN film is formed by sputtering with Ta as the target in an atmosphere containing nitrogen. The W film is formed by sputtering with W as the target. Alternatively, the W film can be obtained by thermal CVD using tungsten hexafluoride ($WF_6$). Whichever method is employed, the W film has to have a low resistivity, desirably, 20 $\mu\Omega$ cm or less, in order to use the W film as a gate electrode. The resistivity of the W film can be lowered by increasing the grain size. However, if there are too many impurity elements such as oxygen in the W film, crystallization is hindered to raise the resistivity. This embodiment mode achieves a resistivity of 9 to 20 $\mu\Omega$ cm by employing sputtering with W of high purity (99.9999%) as the target and by taking a great care not to allow an impurity from the air to mix in in forming the W film.

Next, as shown in FIG. 5A, photolithography is used to form a resist mask 4014 and the first etching treatment is conducted to form electrodes and wiring lines. The first etching treatment is conducted under first and second etching conditions. The first etching conditions in this embodiment mode include using ICP (inductively coupled plasma) etching, employing as etching gas $CF_4$, $Cl_2$, and $O_2$, setting the gas flow rate ratio thereof to 25:25:10 (sccm), and giving an RF (13.46 MHz) power of 500 W to a coiled electrode at a pressure of 1 Pa to generate plasma for etching. Examples of the etching gas used include chlorine-based gas, typically, $Cl_2$, $BCl_3$, $SiCl_4$, or $CCl_4$, fluorine-based gas, typically, $CF_4$, $SF_6$, or $NF_3$, or $O_2$. The substrate side (sample stage) also receives an RF (13.46 MHz) power of 150 W to apply substantially negative self-bias voltage. Under the first etching conditions, the W film is etched to taper the edges of the first conductive layers.

Without removing the resist mask 4014, the etching conditions are switched to the second etching conditions. $CF_4$ and $Cl_2$ are used as etching gas, the gas flow rate ratio thereof is set to 30:30 (sccm), and an RF (13.46 MHz) power of 500 W is given to a coiled electrode at a pressure of 1 Pa to generate plasma for 30 second etching. The substrate side (sample stage) also receives an RF (13.46 MHz) power of 20 W to apply substantially negative self-bias voltage. Under the second etching conditions that include the use of mixture gas of $CF_4$ and $Cl_2$, the W film and the TaN film are etched to about the same degree. The rate of etching the W film is 48.97 nm/min. and the rate of etching the TaN film is 66.43 nm/min. under the second etching conditions. In order to etch the films without leaving any residue on the gate insulating film 4060, the etching time is prolonged by 10 to 20%.

Without removing the resist mask 4014, the first doping treatment is conducted to dope the island-like semiconductor layers 4002 to 4009 with an impurity element that gives the n type conductivity. The doping treatment employs ion doping or ion implantation. In this case, the first shape conductive layers 4015 to 4020 serve as masks against the impurity element and first impurity regions 4021 to 4025, 4026a, and 4026b are formed in a self-aligning manner.

In the first doping treatment, the semiconductor layers 4006 and 4007 that overlap the conductive layers 4018 are hardly doped with the impurity element. Therefore two types of regions are formed in the semiconductor layers 4006 and 4007; the impurity regions 4026a and 4026b that are doped with an impurity element for giving the n type conductivity and regions 4026c and 4026d that are not doped with an impurity element for giving the n type conductivity (actually the regions 4026c and 4026d are doped with a minute amount of impurity element).

Without removing the resist mask 4014, second etching treatment is conducted as shown in FIG. 5B. The second etching treatment employs third and fourth etching conditions. The third etching conditions in this embodiment mode include employing as etching gas $CF_4$ and $Cl_2$, setting the gas flow rate ratio thereof to 30:30 (sccm), and giving an RF (13.46 MHz) power of 500 W to a coiled electrode at a pressure of 1.0 Pa to generate plasma for 15 second etching. The substrate side (sample stage) also receives an RF (13.46 MHz) power of 10 W to apply substantially negative self-bias voltage. The rate of etching the W film is 227.3 nm/min. and the rate of etching the TaN film is 32.0 nm/min. in the second etching treatment. The selective ratio of W to TaN is 7.1, and the rate of etching the gate insulating film 4060 is 33.7 nm/min. in the second etching treatment. When $SF_6$ is used for the etching gas as in this example, the selective ratio with respect to the gate insulating film 4060 is high and reduction in thickness of the film can be avoided. The transistors of the driving circuit portion 101 have higher reliability when the widths of the tapered portions in the channel length direction are larger. Therefore it is effective to perform dry etching using etching gas that contains $SF_6$ in forming the tapered portions.

The fourth etching conditions may include employing as etching gas $CF_4$, $Cl_2$, and $O_2$. In this case, the gas flow rate ratio thereof is set to 20:20:20 (sccm), and an RF (13.46 MHz) power of 500 W is given to a coiled electrode at a pressure of 1.0 Pa to generate plasma for etching. The substrate side (sample stage) also receives an RF (13.46 MHz) power of 20 W to apply substantially negative self-bias voltage. When $CF_4$, $Cl_2$, and $O_2$ are used for the etching gas, the rate of etching the W film is 124.62 nm/min. and the rate of etching the TaN film is 20.67 nm/min. The selective ratio of W to TaN is 6.04. Therefore the W film is selectively etched. At this point, portions of the gate insulating film 4060 that are not covered with the first shape conductive layers 4027 to 4032 are simultaneously etched and thinned (not shown in the drawings).

The second doping treatment is conducted next. In this doping treatment, the second conductive layers 4027b to 4032b are used as masks against an impurity element and the semiconductor layers are doped such that the impurity element reaches the semiconductor layers below the tapered portions of the first conductive layers. In this embodiment mode, the impurity element used is phosphorus (P), and doping conditions for plasma doping include setting the dose to $1.5 \times 10^{14}/cm^2$, the acceleration voltage to 90 keV, the ion current density to 0.5 $\mu A/cm^2$, and the gas flow rate to 30 sccm, and the use of phosphine gas ($PH_3$) diluted with hydrogen by 5.0%. In this way, low concentration impurity regions 4033 to 4037 are formed in a self-aligning manner to overlap the first conductive layers (FIG. 5B).

In the second doping treatment, though not shown in the drawing, the amorphous semiconductor layer 4011b may be doped with the impurity element with the second conductive layer 4030b as a mask to form an impurity region that is doped with a minute amount of impurity element. However, the impurity region that is doped with a minute amount of impurity element does not inhibit the amorphous semiconductor layer 4011b from functioning as the photoelectric conversion layer (i layer) of the photoelectric conversion element 111 if the amount is really minute.

The resist mask 4014 is then removed and the semiconductor layers that later serve as active layers of the n-channel transistors are covered with a resist mask 4038 in preparation of the third doping treatment. Through the third doping treatment, the semiconductor layers that serve as active layers of the p-channel transistors are doped with an impurity element that gives the opposite conductivity type (p type) to the one conductivity type (n type). As a result, p type high concentration impurity regions 4039 to 4042 are formed in the doped semiconductor layers. The semiconductor layers are doped in the impurity element that gives the p type conductivity while using the first conductive layers 4027a to 4032a as masks against the impurity element to obtain the p type impurity regions. (FIG. 5C)

In this embodiment mode, the p type impurity regions 4039 to 4042 are formed by ion doping using diborane ($B_2H_6$). The impurity regions 4021 to 4025 and the impurity regions 4033 to 4037 are doped with phosphorus in different concentrations through the first doping treatment and the second doping treatment. Any of these regions has no trouble in functioning as a source region and a drain region of a p-channel transistor if it is doped with boron in a concentration of $2 \times 10^{20}$ to $2 \times 10^{21}/cm^3$.

A p-channel amplifying transistor 112, a p-channel selecting transistor 112, an n-channel resetting transistor 114, an n-channel transistor 150, and a p-channel transistor 151 are completed through the above steps. In the n-channel transistors, low concentration impurity regions (LDD regions) that do not overlap the first conductive layers are formed.

Figure 6A:
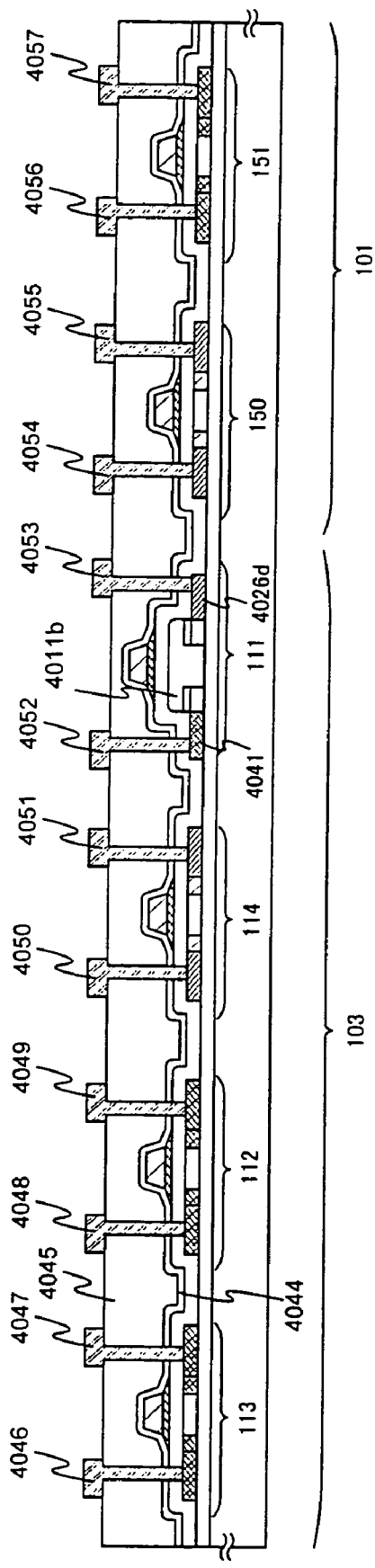
FIGS. 6A and 6B are diagrams showing a process of manufacturing a semiconductor device of the present invention.
Figure 6B:
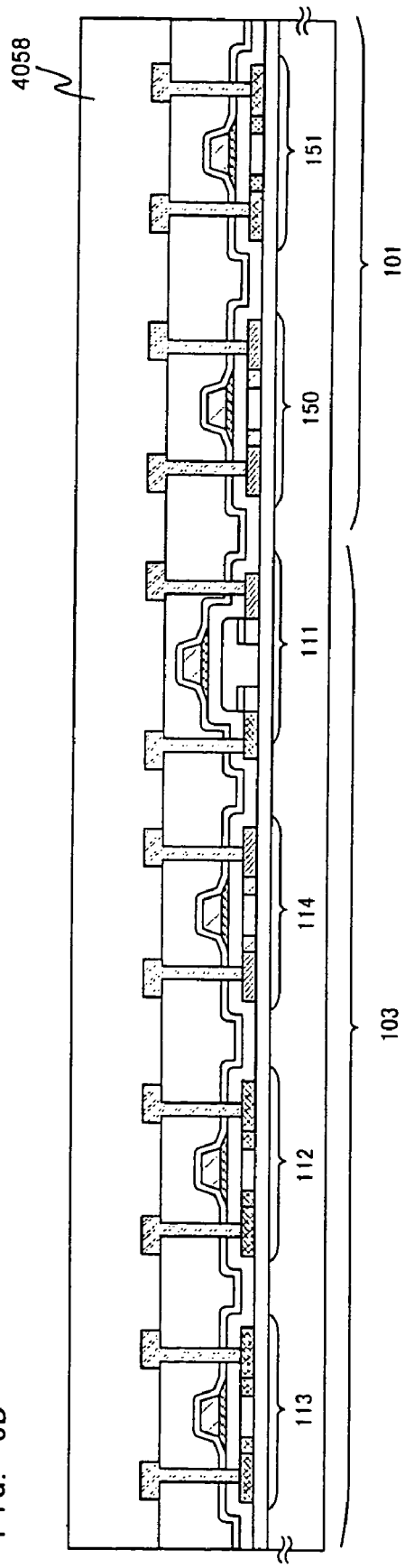

Next, the resist mask 4038 is removed and a first interlayer insulating film 4044 is formed as shown in FIG. 6A. The first interlayer insulating film 4044 is an insulating film containing silicon (for example, a silicon oxide film, a silicon oxynitride film, or a silicon nitride film) and formed by plasma CVD or sputtering to a film thickness of 10 to 2000 nm. In this embodiment mode, a SiON film is formed as the first interlayer insulating film 4044 by plasma CVD to a thickness of 200 nm.

The next step is activation of the impurity elements used to dope the semiconductor layers. The activation step is achieved by thermal annealing using an annealing furnace.

In thermal annealing, the substrate is heated in a nitrogen atmosphere with an oxygen concentration set to 1 ppm or less, preferably 0.1 ppm or less, at 400 to 700° C., typically 400 to 550° C. In the activation step of this embodiment mode, heat treatment is conducted at 550° C. for four hours. Other than thermal annealing, laser annealing, rapid thermal annealing (RTA), or the like can be employed in the activation step.

During the activation treatment in this embodiment mode, gettering is simultaneously achieved. Through the gettering, nickel used as a catalyst in crystallization is moved into impurity regions containing high concentration of phosphorus and the Ni concentration is reduced in the semiconductor layers for mainly forming channel formation regions. The channel formation regions thus formed lower the OFF current value and improve the crystallinity in transistors, and therefore achieve high field effect mobility and excellent characteristics.

In this embodiment mode, gettering utilizes phosphorus contained in the source regions and the drain regions. Alternatively, gettering may be achieved through heat treatment that follows doping of other regions than the island-like semiconductor layers with P, Ar, or other inert gas before forming the island-like semiconductor layers. This method requires one additional mask but excellent gettering effect can be obtained.

The activation treatment may precede formation of the first interlayer insulating film 4044. However, if wiring materials used are weak against heat, it is preferred to form the interlayer insulating film (insulating film mainly containing silicon, for example, a silicon nitride film) and then conduct the activation treatment as in this embodiment mode in order to protect the wiring lines.

Next, the semiconductor layers are hydrogenated by heat treatment (at 300 to 660° C. for 1 to 12 hours). In this embodiment mode, the heat treatment is conducted in a 100% hydrogen atmosphere at 410° C. for four hours. This step is for terminating dangling bonds in the semiconductor layers. Other usable hydrogenation measures include plasma hydrogenation (which uses hydrogen excited by plasma). If laser annealing is employed for the activation treatment, it is desirable to irradiate the semiconductor layers with laser light such as excimer laser and YAG laser after the above hydrogenation.

Next, a second interlayer insulating film 4045 is formed to a film thickness of 800. The second interlayer insulating film 4045 is an insulating film containing silicon (for example, a silicon oxide film, a silicon oxynitride film, or a silicon nitride film) and formed by plasma CVD or sputtering to a film thickness of 10 to 2000 nm. In this embodiment mode, a SiON film with a film thickness of 800 nm is formed as the second interlayer insulating film 4045 by plasma CVD.

Contact holes reaching the impurity regions 4023, 4025, 4026b, and 4039 to 4042 are formed next as shown in FIG. 6A. A metal film is formed on the contact holes. The metal film is formed of a film mainly containing Al or Ag or a material similar to this film. Then patterning follows for forming wiring lines 4046 to 4057 that are electrically connected to the impurity regions.

The wiring line 4052 and the wiring line 4053 are connected to the n type semiconductor layer 4026a of the photoelectric conversion element 111 and the p type semiconductor layer 4041 thereof, respectively. The wiring lines 4052 and 4053 are electrically connected to the source region or the drain region of one of the amplifying transistor 113, the selecting transistor 112, and the resetting transistor 114, or to power supply lines (VB1 to VBx) or other wiring lines. In the case of the semiconductor device shown in FIG. 12, the conductivities of the amplifying transistor 113, the selecting transistor 112, and the resetting transistor 114, the voltage applied to the power supply lines (VB1 to VBx), and the voltage applied to a power supply reference line 121 determine which of the three transistors is to be connected to the wiring line 4052 and the wiring line 4053 at its source region or drain region.

The impurity region 4026d, the impurity region 4041, and the amorphous semiconductor layer 4011b constitute the photoelectric conversion element 111. In this embodiment mode, the impurity region 4026d is the n type semiconductor layer, the amorphous semiconductor layer 4011b is the photoelectric conversion layer (i layer), and the impurity region 4041 is the p type semiconductor layer.

An insulating film containing silicon (for example, a silicon oxide film, a silicon oxynitride film, or a silicon nitride film) is formed as a third interlayer insulating film 4058 by plasma CVD or sputtering to a thickness of 10 to 1000 nm. The third interlayer insulating film 4058 in this embodiment mode is an organic resin film formed by plasma CVD to a thickness of 800 nm.

The photoelectric conversion element 111 and the transistors for controlling the photoelectric conversion element 111 in the pixel portion 103 and the transistors of the driving circuit portion 101 can be formed on the same substrate through the above process.

The number of masks used in this embodiment mode is five necessary to form the transistors alone (a mask for forming the island-like semiconductor layers 4002 to 4009, the mask 4014 for forming the gate electrodes 4015 to 4020, the mask 4033 for forming the p type impurity regions, a mask for forming contact holes for the wiring lines 4042 to 4057, and a mask for forming the wiring lines 4046 to 4057) plus one (a mask necessary to form the amorphous semiconductor layer 4011a by patterning).

The resetting transistor 114 is an n-channel transistor and the amplifying transistor 112 and the selecting transistor 112 are p-channel transistors in this embodiment mode. Note that the present invention is not limited thereto and the transistors can have either polarity of the n type and p type. However, the polarity of the selecting transistor 112 is preferably reverse to the polarity of the resetting transistor 114.

Embodiment Mode 3

This embodiment mode describes in detail a method which is different from Embodiment Modes 1 and 2 of simultaneously forming a photoelectric conversion element and transistors of a pixel portion in a semiconductor device and transistors of a driving circuit portion (a source signal line driving circuit and a gate signal line driving circuit) that is placed in the periphery of the pixel portion.

As shown in FIG. 10, a source signal line driving circuit 90 and a gate signal line driving circuit 92 are collectively called as a driving circuit portion 101 in this specification. The driving circuit portion 101 in this embodiment mode is a CMOS circuit that is a basic unit. In the semiconductor device described in this embodiment mode, a pixel 102 of a pixel portion 103 has a photoelectric conversion element 111, an amplifying transistor 113, a selecting transistor 112, and a resetting transistor 114 as shown in FIG. 12.

Reference is made to FIG. 7A. A substrate 7000 in this embodiment mode is formed of glass such as barium borosilicate glass and alumino borosilicate glass typical example of which are Coming #7059 glass and #1737 glass (products of Coming Incorporated). The substrate 7000 is not limited as long as the substrate has light transmission property, and it may be a quartz substrate. A plastic substrate may also be used if it has a heat resistance that can withstand the treatment temperature of this embodiment mode.

A base insulating film 7001 is formed next. The base insulating film 7001 is an insulating film containing silicon (for example, a silicon oxide film, a silicon oxynitride film, or a silicon nitride film) and formed by plasma CVD or sputtering In this embodiment mode, a silicon oxynitride film with a thickness of 150 nm is used.

As shown in FIG.7A, an amorphous semiconductor film is formed on the base insulating film 7001 to a thickness of 30 to 60 nm. Then, the amorphous semiconductor film is subjected to known crystallization treatment (laser crystallization, thermal crystallization, or thermal crystallization that uses Ni or other catalysts) to obtain a crystalline semiconductor film.

In this embodiment mode, an amorphous semiconductor film is formed by plasma CVD to a thickness of 54 nm, and then a solution containing Ni is held to the surface of the amorphous semiconductor film. After dehydrating the amorphous semiconductor film (at 500° C. for an hour), the amorphous semiconductor film is subjected to thermal crystallization (at 550° C. for four hours), and then to laser annealing treatment for improving the crystallinity to obtain a crystalline semiconductor film. The semiconductor film may be doped with an impurity element that gives the p type conductivity in order to control the threshold voltage ($V_{th}$) of an n-channel transistor. Known as an impurity element that gives the p type conductivity is a Group 13 element in the periodic table, such as boron (B), aluminum (Al), and gallium (Ga).

Next, an insulating film containing silicon (for example, a silicon oxide film, a silicon oxynitride film, or a silicon nitride film) is formed by plasma CVD or sputtering on the crystalline semiconductor film. The obtained amorphous semiconductor film and the insulating film that is formed on the amorphous semiconductor film are patterned into desired shapes to form island-like semiconductor layers 7002 to 7009 and insulating layers 7010a to 7010g.

Next, an amorphous semiconductor film 7011a with a thickness of 30 to 60 nm is formed so as to cover the island-like semiconductor layers 7002 to 7009 and the insulating layers 7010a to 7010g. As shown in FIG. 7A, a microcrystal semiconductor film 7061b is formed on the amorphous semiconductor film 7011a. The microcrystal semiconductor film 7061b can be formed by any known method and the hydrogen dilution method is employed in this embodiment mode.

As shown in FIG. 7B, the amorphous semiconductor film 7011a and the microcrystal semiconductor film 7061a are patterned such that the resultant films, namely, an amorphous semiconductor layer 7011b and a microcrystal semiconductor layer 7061b, partially overlap the semiconductor layers 7006 and 7007.

The amorphous semiconductor layer 4011b later functions as the photoelectric conversion layer (i layer) of the photoelectric conversion element 111. The microcrystal semiconductor layer 7061b later functions as either the p type semiconductor layer or n type semiconductor layer of the photoelectric conversion element 111.

Of the insulating layers 7010a to 7010g, the insulating layers in the exposed regions (the insulating layers in the regions that are not covered with the amorphous semiconductor layer 7011b) are etched. At this point, portions of the insulating layers 7010d and 7010e that are not covered with the amorphous semiconductor layer 7011b are etched to become insulating layers 7010h and 7010i (FIG. 7B).

A gate insulating film 7060 is formed next to cover the semiconductor layers 7002 to 7009. The gate insulating film 7060 is an insulating film containing silicon and is formed by plasma CVD or sputtering to a thickness of 70 to 170 nm. The gate insulating film 7060 here is a single layer or laminate of insulating films containing silicon.

Layered on the gate insulating film 7060 are a first conductive film (TaN film) 7012 with a film thickness of 20 to 100 nm and a second conductive film (W film) 7013 with a film thickness of 100 to 700 nm. The first conductive film 7012 and the second conductive film 7013 may be formed of elements selected from the group consisting of Ta, W, Ti, Mo, Al, and Cu, or formed of alloy materials or compound materials mainly containing the elements listed in the above. A semiconductor film doped with an impurity element, typically a silicon film doped with phosphorus (P) (p-Si film), may be used instead.

In this embodiment mode, the first conductive film 7012 made from a TaN film with a thickness of 30 nm and the second conductive film 7013 made from a W film with a film thickness of 370 nm are laminated. The TaN film is formed by sputtering with Ta as the target in an atmosphere containing nitrogen. The W film is formed by sputtering with W as the target. Alternatively, the W film can be obtained by thermal CVD using tungsten hexafluoride ($WF_6$). Whichever method is employed, the W film has to have a low resistivity, desirably, 20 µ106 cm or less, in order to use the W film as a gate electrode. The resistivity of the W film can be lowered by increasing the grain size. However, if there are too many impurity elements such as oxygen in the W film, crystallization is hindered to raise the resistivity. This embodiment mode achieves a resistivity of 9 to 20 µΩ cm by employing sputtering with W of high purity (99.9999%) as the target and by taking a great care not to allow an impurity from the air to mix in in forming the W film.

Next, as shown in FIG. 8A, photolithography is used to form a resist mask 7014 and the first etching treatment is conducted to form electrodes and wiring lines. The first etching treatment is conducted under first and second etching conditions. The first etching conditions in this embodiment mode include using ICP etching, employing as etching gas $CF_7$, $Cl_2$, and $O_2$, setting the gas flow rate ratio thereof to 25:24:10 (sccm), and giving an RF (13.76 MHz) power of 500 W to a coiled electrode at a pressure of 1.0 Pa to generate plasma for etching. Examples of the etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$. The substrate side (sample stage) also receives an RF (13.76 MHz) power of 170 W to apply substantially negative self-bias voltage. Under the first etching conditions, the W film is etched to taper the edges of the first conductive layers.

Without removing the resist mask 7014, the etching conditions are switched to the second etching conditions. $CF_7$ and $Cl_2$ are used as etching gas, the gas flow rate ratio thereof is set to 30:30 (sccm), and an RF (13.76 MHz) power of 500 W is given to a coiled electrode at a pressure of 1.0 Pa to generate plasma for 30 second etching. The substrate side (sample stage) also receives an RF (13.76 MHz) power of 20 W to apply substantially negative self-bias voltage. Under the second etching conditions that include the use of mixture gas of $CF_7$ and $Cl_2$, the W film and the TaN film are etched to the same degree. The rate of etching the W film is 78.97 nm/min. and the rate of etching the TaN film is 66.73 nm/min. under the second etching conditions. In order to etch the films without leaving any residue on the gate insulating film 7060, the etching time is prolonged by 10 to 20%.

Without removing the resist mask 7014, first doping treatment is conducted to dope the island-like semiconductor layers 7002 to 7009 with an impurity element that gives the n type conductivity. The doping treatment employs ion doping or ion implantation. In this case, the first shape conductive layers 7015 to 7019 serve as masks against the impurity element and first impurity regions 7020 to 7025, 7026*a*, and 7026*d* are formed in a self-aligning manner.

In the first doping treatment, regions of the semiconductor layers 4006 and 4007 that overlap the microcrystal semiconductor layer 7020 are hardly doped with the impurity element. Therefore roughly two types of regions are formed in the semiconductor layers 4006 and 4007; the impurity regions 7026*a* and 7026*d* that are doped with an impurity element for giving the n type conductivity and regions 7026*b* and 7026*c* that are not doped with an impurity element for giving the n type conductivity (actually the regions 7026*b* and 7026*c* are doped with a minute amount of impurity element).

Without removing the resist mask 7014, second etching treatment is conducted as shown in FIG. 8B. The second etching treatment employs third and fourth etching conditions. The third etching conditions in this embodiment mode include employing as etching gas $CF_4$ and $Cl_2$, setting the gas flow rate ratio thereof to 30:30 (sccm), and giving an RF (13.46 MHz) power of 500 W to a coiled electrode at a pressure of 1.0 Pa to generate plasma for 15 second etching. The substrate side (sample stage) also receives an RF (13.46 MHz) power of 10 W to apply substantially negative self-bias voltage. The rate of etching the W film is 227.3 nm/min. and the rate of etching the TaN film is 32.0 nm/min. in the second etching treatment. The selective ratio of W to TaN is 7.1, and the rate of etching the gate insulating film 7060 is 33.7 nm/min. in the second etching treatment. When $SF_6$ is used for the etching gas as in this example, the selective ratio with respect to the gate insulating film 7060 is high and reduction in thickness of the film can be avoided. The transistors of the driving circuit portion have higher reliability when the widths of the tapered portions in the channel length direction are larger. Therefore it is effective to perform dry etching using etching gas that contains $SF_6$ in forming the tapered portions.

The fourth etching conditions may include employing as etching gas $CF_4$, $Cl_2$, and $O_2$. In this case, the gas flow rate ratio thereof is set to 20:20:20 (sccm), and an RF (13.46 MHz) power of 500 W is given to a coiled electrode at a pressure of 1.0 Pa to generate plasma for etching. The substrate side (sample stage) also receives an RF (13.46 MHz) power of 20 W to apply substantially negative self-bias voltage. When $CF_4$, $Cl_2$, and $O_2$ are used for the etching gas, the rate of etching the W film is 124.62 nm/min. and the rate of etching the TaN film is 20.67 nm/min. The selective ratio of W to TaN is 6.04. Therefore the W film is selectively etched. At this point, portions of the gate insulating film 7060 that are not covered with the first shape conductive layers 7015 to 7019 are simultaneously etched and thinned (not shown in the drawings).

The second doping treatment is conducted next. In this doping treatment, the second conductive layers 7027*b* to 7031*b* are used as masks against an impurity element and the semiconductor layers are doped such that the impurity element reaches the semiconductor layers below the tapered portions of the first conductive layers. In this embodiment mode, the impurity element used is phosphorus (P), and doping conditions for plasma doping include setting the dose to $1.5\times10^{17}/cm^2$, the acceleration voltage to 90 keV, the ion current density to 0.5 $\mu A/cm^2$, and the gas flow rate to 30 sccm, and the use of phosphine gas diluted with hydrogen by 5.0%. In this way, low concentration impurity regions 7033 to 7037 are formed in a self-aligning manner to overlap the first conductive layers (FIG. 8B).

The resist mask 7014 is then removed and the semiconductor layers that later serve as active layers of the n-channel transistors are covered with a resist mask 7038. Through third doping treatment, the semiconductor layers that serve as active layers of the p-channel transistors are doped with an impurity element that gives the opposite conductivity type (p type) to the one conductivity type (n type). As a result, p type high concentration impurity regions 7039 to 7042 are formed in the doped semiconductor layers. The semiconductor layers are doped in the impurity element that gives the p type conductivity while using the first conductive layers 7027*a* to 7031*a* as masks against the impurity element to obtain the p type impurity regions. (FIG. 8C)

A resist mask 7038 is formed next. Desirably, the resist mask 7038 does not cover the microcrystal semiconductor layer 7020. However, in some cases, the resist mask 7038 accidentally overlaps a part of the microcrystal semiconductor layer 7020 as shown in FIG. 8C. Then a region of the microcrystal semiconductor layer 7020 that is not covered with the resist mask 7038 (the exposed region) is doped with an impurity element for giving the p type conductivity. As a result, impurity regions different in polarity from each other, namely, a p type impurity region 7041 and an n type impurity region 7043, are formed in the microcrystal semiconductor layer 7020.

In this embodiment mode, the p type impurity regions 7039 to 7042 are formed by ion doping using diborane ($B_2H_6$). The impurity regions 7021 to 7025 and the impurity regions 7033 to 7037 are doped with phosphorus in different concentrations through the first doping treatment and the second doping treatment. Any of these regions has no trouble in functioning as a source region and drain region of a p-channel transistor if it is doped with boron in a concentration of $2\times10^{20}$ to $2\times10^{21}/cm^3$.

In a pixel portion 103, p-channel amplifying transistor 112, a p-channel selecting transistor 112, an n-channel resetting transistor 117 and photo electric element 111 are completed through the above steps. Also formed respectively are an n-channel transistor 150 and a p-channel transistor 151 as a driving circuit portion 101. In the n-channel transistors, low concentration impurity regions (LDD regions) that do not overlap the first conductive layers are formed.

Next, the resist mask 7038 is removed and a first interlayer insulating film 7044 is formed as shown in FIG. 9A. The first interlayer insulating film 7044 is an insulating film containing silicon (for example, a silicon oxide film, a silicon oxynitride film, or a silicon nitride film) and formed by plasma CVD or sputtering to a film thickness of 10 to 1000 nm. In this embodiment mode, a SiON film is formed as the first interlayer insulating film 7044 by plasma CVD to a film thickness of 800 nm.

The next step is activation of the impurity elements used to dope the semiconductor layers. The activation step is achieved by thermal annealing using an annealing furnace. In thermal annealing, the substrate is heated in a nitrogen atmosphere with an oxygen concentration set to 1 ppm or less, preferably 0.1 ppm or less, at 400 to 700° C., typically 400 to 550° C. In the activation step of this embodiment mode, heat treatment is conducted at 550° C. for four hours.

Other than thermal annealing, laser annealing, rapid thermal annealing (RTA), or the like can be employed in the activation step.

During the activation treatment in this embodiment mode, gettering is simultaneously achieved. Through the gettering, nickel used as a catalyst in crystallization is moved into impurity regions containing high concentration of phosphorus and the Ni concentration is reduced in the semiconductor layers for mainly forming channel formation regions. The channel formation regions thus formed lower the OFF current value and improve the crystallinity in transistors, and therefore provide high field effect mobility and excellent characteristics.

In this embodiment mode, gettering utilizes phosphorus contained in the source regions and the drain regions. Alternatively, gettering may be achieved through heat treatment that follows doping of other regions than the island-like semiconductor layers with P, Ar, or other inert gas before forming the island-like semiconductor layers. This method requires one additional mask but excellent gettering effect can be obtained.

The activation treatment may also precede formation of the first interlayer insulating film 7044. However, if wiring line materials used are weak against heat, it is preferred to form the interlayer insulating film (insulating film mainly containing silicon, for example, a silicon nitride film) and then conduct the activation treatment as in this embodiment mode in order to protect the wiring lines.

Next, the semiconductor layers are hydrogenated by heat treatment (at 300 to 770° C. for 1 to 12 hours). In this embodiment mode, the heat treatment is conducted in a 100% hydrogen atmosphere at 410° C. for four hours. This step is for terminating dangling bonds in the semiconductor layers. Other usable hydrogenation measures include plasma hydrogenation (which uses hydrogen excited by plasma).

If laser annealing is employed for the activation treatment, it is desirable to irradiate the semiconductor layers with laser light such as excimer laser and YAG laser after performing the above hydrogenation.

Contact holes reaching the impurity regions 7023, 7024, 7026a, 7026d and 7039 to 7042 are formed next as shown in FIG. 9A. A metal film is formed on the contact holes. The metal film is formed of a film mainly containing Al or Ag or a material similar to this film. Then patterning follows for forming wiring lines 7046 to 7058 that are electrically connected to the impurity regions.

The wiring lines 7052, 7053, and 7058 are connected to the n type semiconductor layers 7026a and 7026d of the photoelectric conversion element 111 and the p type semiconductor layer 7041 thereof, respectively. The wiring lines 7052, 7053, and 7058 are electrically connected to the source region or the drain region of one of the amplifying transistor 113, the selecting transistor 112, and the resetting transistor 114, or to power supply lines (VB1 to VBx) or other wiring lines. The conductivities of the amplifying transistor 113, the selecting transistor 112, and the resetting transistor 114, the voltage applied to the power supply lines (VB1 to VBx), and the voltage applied to a power supply reference line 121 determine which of the three transistors is to be connected to the wiring lines 7052, 7053, and 7058 at its source region or drain region.

The impurity regions 7026a and 7026d function as the n type semiconductor layers. The amorphous semiconductor layer 7011b functions as the photoelectric conversion layer (i layer), and the microcrystal semiconductor layer 7041 functions as the p type semiconductor layer. The semiconductor layers 7026b and 7026c also function as the photoelectric conversion layer (i layer).

Next, an insulating film containing silicon (for example, a silicon oxide film, a silicon oxynitride film, or a silicon nitride film) is formed as a second interlayer insulating film 7058 by plasma CVD or sputtering to a film thickness of 10 to 2000 nm. In this embodiment mode, the second interlayer insulating film 7058 is a SiON film formed by plasma CVD to a film thickness of 800 nm.

The photoelectric conversion element 111 and the transistors for controlling the photoelectric conversion element 111 in the pixel portion 103 and the transistors of the driving circuit portion 101 can be formed on the same substrate through the above process.

The number of masks used in this embodiment mode is five necessary to form the transistors alone (a mask for forming the island-like semiconductor layers 7002 to 7009, the mask 7014 for forming the conductive layers 7012 to 7019, the mask 7038 for forming the p type impurity regions, a mask for forming contact holes for the wiring lines 7046 to 7057, and a mask for forming the wiring lines 7046 to 7057) plus one (a mask necessary to pattern the amorphous semiconductor film 7011a and the microcrystal semiconductor film 7061a).

The resetting transistor 117 is an n-channel transistor and the amplifying transistor 113 and the selecting transistor 112 are p-channel transistors in this embodiment mode. Note that the present invention is not limited thereto and the transistors can have either polarity of the n type and p type. However, the polarity of the selecting transistor 112 is preferably reverse to the polarity of the resetting transistor 117.

Embodiment 1

This embodiment shows an example of the circuit structure of a semiconductor device according to the present invention with reference to FIG. 10.

The semiconductor device in this embodiment has a source signal line driving circuit 90, a pixel portion 103, and a gate signal line driving circuit 92. In this specification, the source signal line driving circuit 90 and the gate signal line driving circuit 92 are collectively called a driving circuit portion 101.

The source signal line driving circuit 90 has a shift register 90a, a sample & hold circuit 90b, a signal output line driving circuit 90c, and a buffer 90d. The gate signal line driving circuit 92 has a shift register 92a and a buffer 92b. If necessary, a level shifter circuit may be provided between the sampling circuit and the shift register.

In this embodiment, the pixel portion 103 has a plurality of pixels. TFTs that constitute the source signal line driving circuit 90 and the gate signal line driving circuit 92 may be all p-channel TFTs or may be all n-channel TFTs.

Although this embodiment shows the structures of the pixel portion 103 and driving circuit portion 101 alone, the semiconductor device may further have a memory and a microprocessor.

This embodiment can be combined freely with Embodiment Modes 1 through 3.

Embodiment 2

This embodiment describes an example of circuit diagram of a semiconductor device to which the present invention is applicable.

Figure 11:
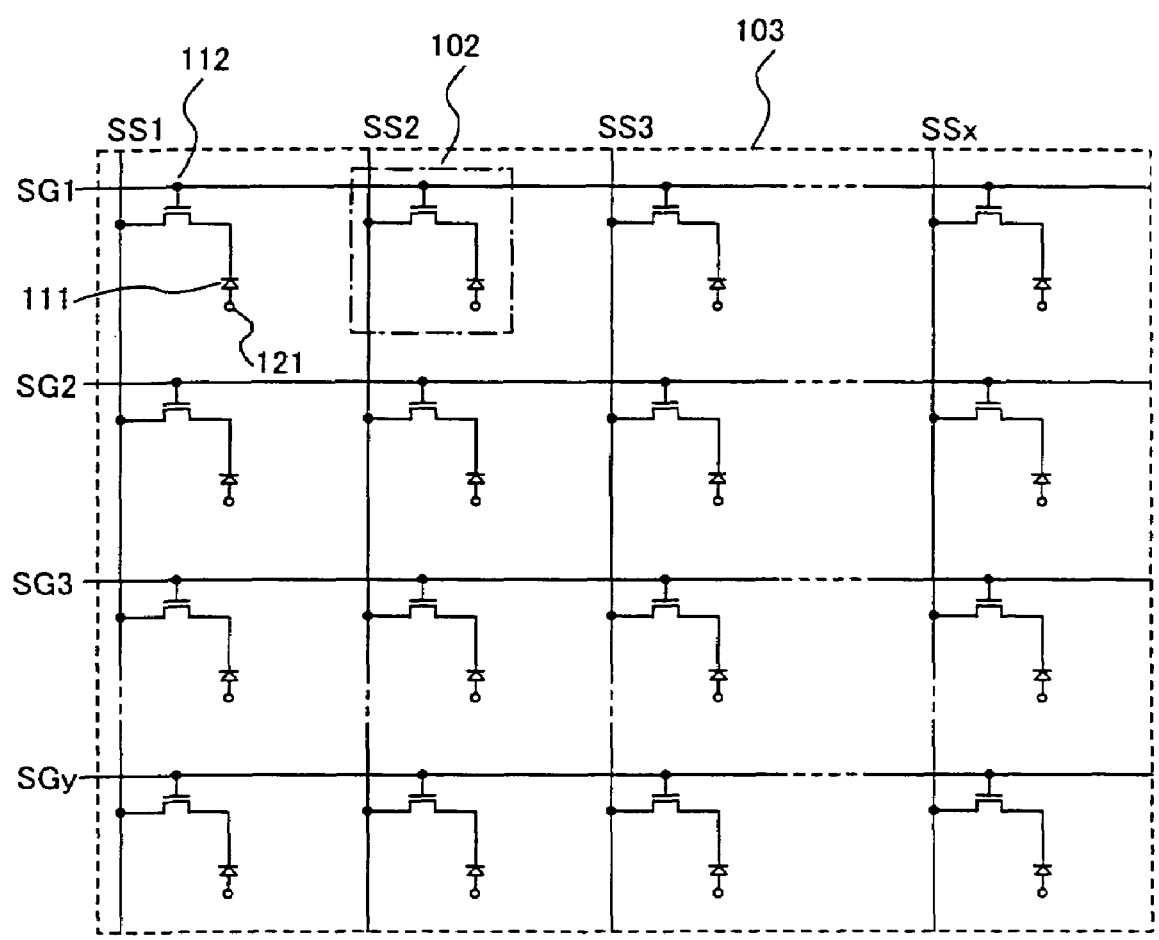
FIG. 11 is a diagram showing a pixel portion in a semiconductor device of the present invention.

FIG. 11 is a circuit diagram of a pixel portion in the semiconductor device. A pixel portion 103 has sensor selecting signal lines (SG1 to SGy) and sensor signal output lines (SS1 to SSx).

The pixel portion 103 has a plurality of pixels. Each of the pixels are denoted by 102 and has a photodiode 111, a sensor selecting transistor 112, one of the sensor selecting signal lines (SG1 to SGy), and one of the sensor signal output lines (SS1 to SSx).

A p-channel side terminal of the photodiode 111 is connected to a power supply reference line 121. The sensor selecting transistor 112 has a source region and a drain region one of which is connected to an n-channel side terminal of the photodiode 111 and the other of which is connected to one of the sensor signal output lines (SS1 to SSx). A gate electrode of the sensor selecting transistor 112 is connected to one of the sensor selecting signal lines (SG1 to SGy).

This embodiment can be combined freely with Embodiment Modes 1 through 3 and Embodiment 1.

Embodiment 3

This embodiment describes an example of circuit diagram of a semiconductor device, which is different from the one described in Embodiment 1.

FIG. 12 is a circuit diagram of a pixel portion in an active semiconductor device. A pixel portion 103 has sensor selecting signal lines (SG1 to SGy), sensor reset signal lines (SR1 to SRy), sensor signal output lines (SS1 to SSx), and sensor power supply lines (VB1 to VBx).

The pixel portion 103 has a plurality of pixels. Each of the pixels are denoted by 102 and has a photodiode 111, a sensor selecting transistor 112, an amplifying transistor 113, a sensor resetting transistor 114, one of the sensor selecting signal lines (SG1 to SGy), one of the sensor reset signal lines (SR1 to SRy), one of the sensor signal output lines (SS1 to SSx), and one of the sensor power supply lines (VB1 to VBx).

A p-channel side terminal of the photodiode 111 is connected to a power supply reference line 121, and an n-channel side terminal thereof is connected to a gate electrode of the amplifying transistor 113.

The amplifying transistor 113 has a source region and a drain region one of which is connected to one of the sensor power supply lines (VB1 to VBx) and the other of which is connected to a drain region of the sensor selecting transistor 112. The amplifying transistor 113 together with a bias transistor 120 constitutes a source follower circuit. Accordingly, it is preferable for the amplifying transistor 113 to have the same polarity as the bias transistor 120.

A gate electrode of the sensor selecting transistor 112 is connected to one of the sensor selecting signal lines (SG1 to SGy). A source region of the sensor selecting transistor 112 is connected to one of the sensor signal output lines (SS1 to SSx).

A gate electrode of the sensor resetting transistor 114 is connected to one of the sensor reset signal lines (SR1 to SRy). The sensor resetting transistor 114 has a source region and a drain region one of which is connected to one of the sensor power supply lines (VB1 to VBx) and the other of which is connected to the gate electrode of the amplifying transistor 113.

The bias transistor 120 has a source region and a drain region one of which is connected to one of the sensor signal output lines (SS1 to SSx) and the other of which is connected to a power supply line 122. A gate electrode of the bias transistor 120 is connected to a bias signal line (B.S.).

This embodiment can be combined freely with Embodiment Modes 1 through 3 and Embodiments 1 and 2.

Embodiment 4

Figure 13:
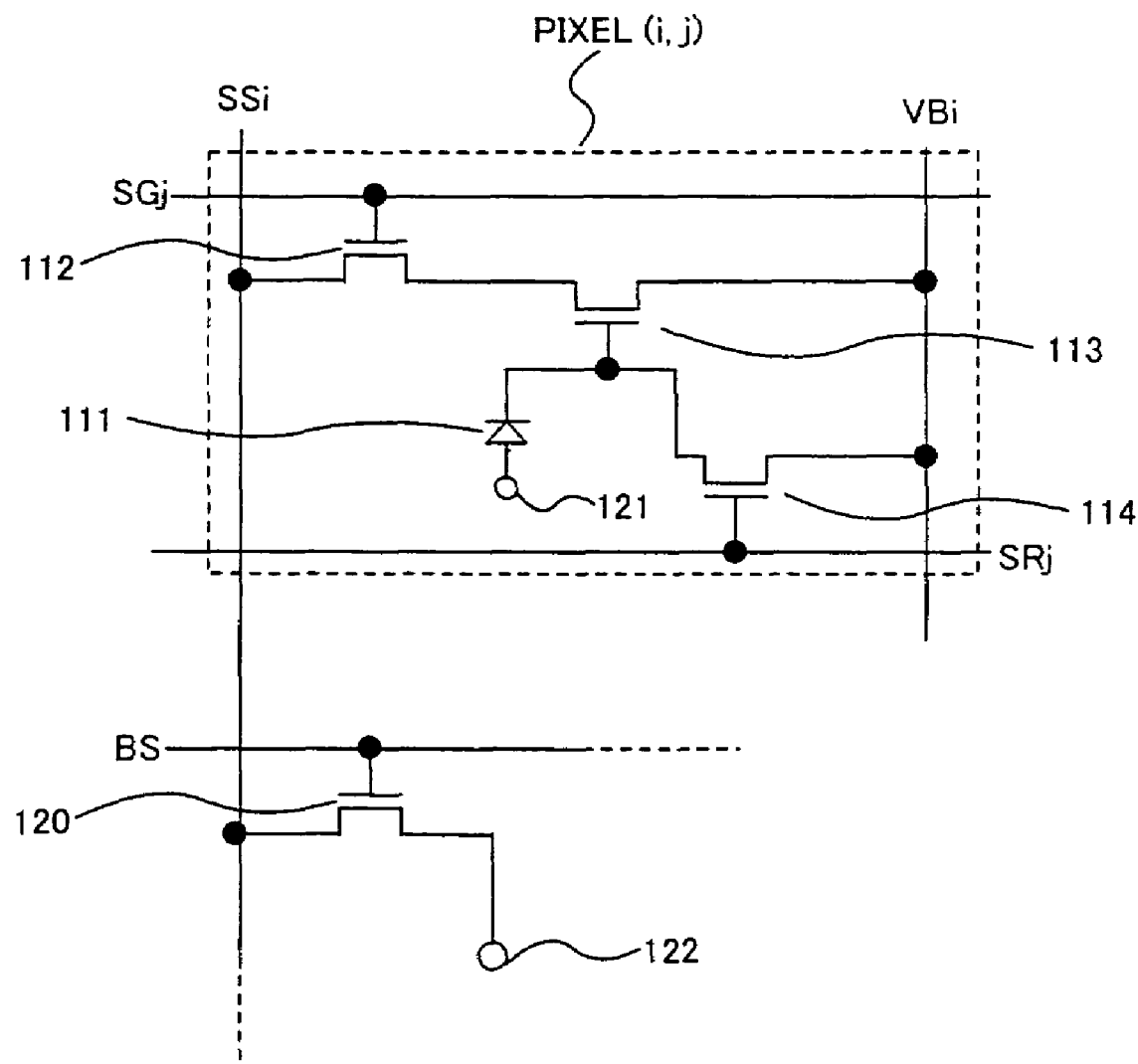
FIG. 13 is a circuit diagram of a semiconductor device to which the present invention is applied.

This embodiment gives a description on the basic operation of the semiconductor device described in Embodiment 2. FIG. 13 shows a pixel (i,j) located at Row i and Column j in the pixel portion 103 of FIG. 12.

First, the sensor resetting transistor 114 is turned conductive. As the sensor resetting transistor 114 is turned conductive, the p-channel terminal of the photoelectric conversion element 111 is connected to the power supply reference line 121 and the n-channel terminal of the photoelectric conversion element 111 is electrically connected to the sensor power supply line (VBi). At this point, the electric potential of the power supply reference line 121 is at a reference electric potential 0 V and the electric potential of the sensor power supply line (VBi) is at a power supply electric potential Vdd. Accordingly, a reverse bias voltage is given to the photoelectric conversion element 111. In this specification, a charging operation in which the electric potential of the n-channel terminal of the photoelectric conversion element 111 is raised to the level of the electric potential of the sensor power supply line (VBi) is called a reset operation.

Next, the sensor resetting transistor 114 is turned unconductive. With the sensor resetting transistor 114 being unconductive, the photoelectric conversion element 111 generates electric charges through photoelectric conversion if the photoelectric conversion element 111 is irradiated with light. Therefore, the electric potential of the n-channel terminal of the photoelectric conversion element 111, which has been raised to the level of the electric potential of the sensor power supply line (VBi), is gradually lowered with time.

After allowing a certain period of time to pass, the sensor selecting transistor 112 is turned conductive. As the sensor selecting transistor 112 is turned conductive, the electric potential of the n-channel terminal of the photoelectric conversion element 111 is outputted to the sensor signal output line (SSi) through the amplifying transistor 113.

However, while the electric potential of the n-channel terminal of the photoelectric conversion element 111 is outputted to the sensor signal output line (SSi), an electric potential is given to the bias signal line (B.S.). That means a current is flowing in the bias transistor 120 during this and therefore the amplifying transistor 113 and the bias transistor 120 are functioning as a source follower circuit.

The wiring line to which the p-channel terminal of the photoelectric conversion element 111 is connected in FIG. 13, namely, the power supply reference line 121 may also be called a photoelectric conversion element side power supply line. The electric potential of the photoelectric conversion element side power supply line changes depending on how the photoelectric conversion element 111 is aligned. In FIG. 13, the photoelectric conversion element side power supply line is connected to the p-channel terminal of the photoelectric conversion element 111 and has the reference electric potential 0 V. This is why the photoelectric conversion element side power supply line is called as a power supply reference line in FIG. 13.

Similarly, the wiring line to which the sensor resetting transistor 114 is connected in FIG. 13, namely, the sensor power supply line (VBi) may also be called a reset side power supply line. The electric potential of the reset side power supply line changes depending on how the photoelectric conversion element 111 is aligned. In FIG. 13, the reset side power supply line is connected to the n-channel terminal of the photoelectric conversion element 111 through the sensor resetting transistor 114 and has the power supply electric potential Vdd. This is why the reset side power supply line is called as a power supply line in FIG. 13.

The operation of resetting the photoelectric conversion element 111 is identical with the operation of giving the photoelectric conversion element 111 a reverse bias voltage. Accordingly, which of the photoelectric conversion element side power supply line and the reset side power supply line has a higher electric potential changes depending on how the photoelectric conversion element 111 is aligned.

Figure 14:
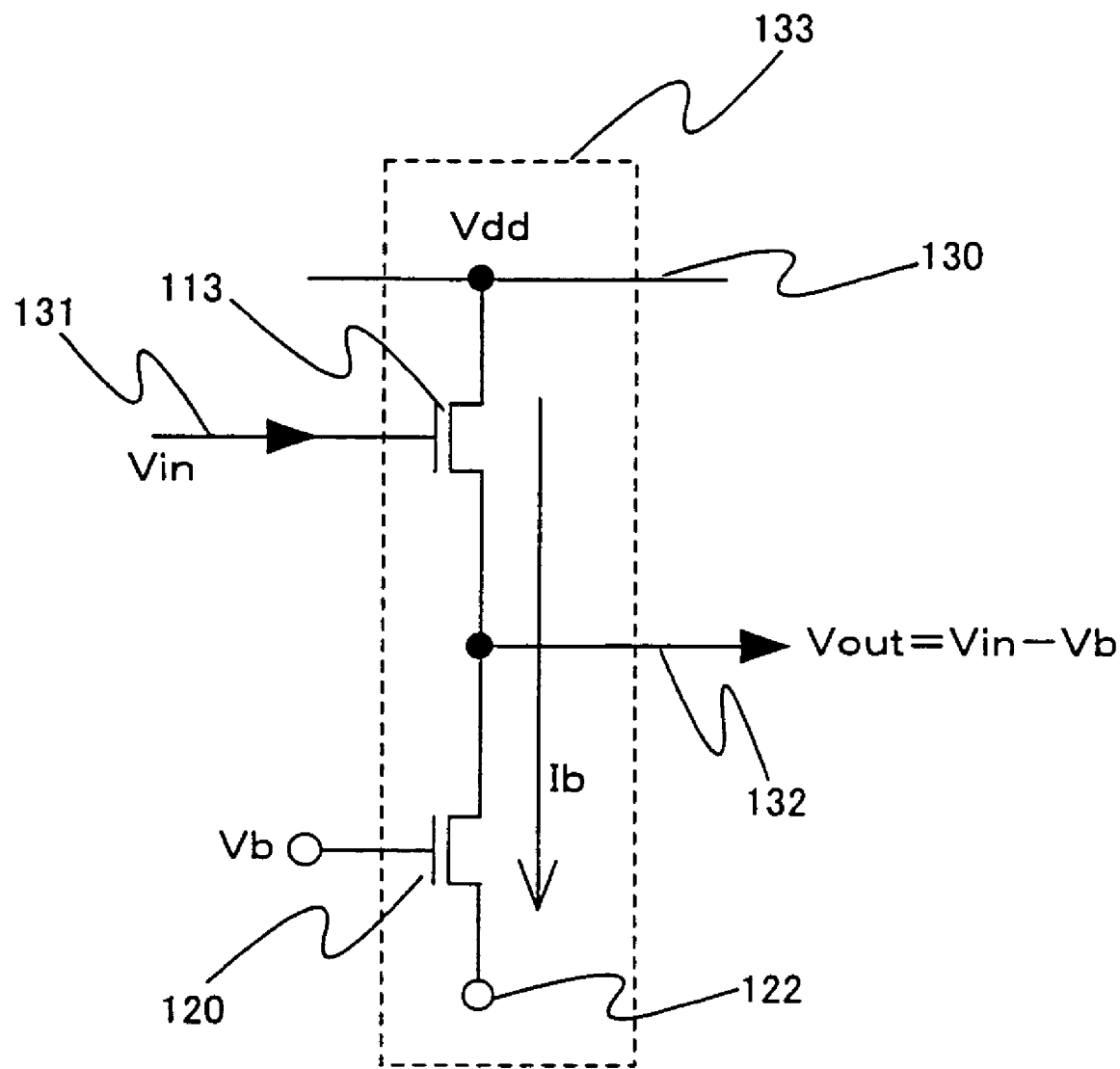
FIG. 14 is a circuit diagram of a semiconductor device to which the present invention is applied.

Next, an example of a basic source follower circuit is shown in FIG. 14. The example shown in FIG. 14 uses n-channel transistors but p-channel transistors may be used to constitute the source follower circuit.

An amplifier side power supply line 130 receives the power supply electric potential Vdd and the power supply line 122 receives the reference electric potential 0 V. The drain region of the amplifying transistor 113 is connected to the amplifier side power supply line 130 and the source region of the amplifying transistor 113 is connected to the drain region of the bias transistor 120. The source region of the bias transistor 120 is connected to the power supply line 122.

The gate electrode of the bias transistor 120 receives a bias electric potential Vb and a bias current Ib flows in the bias transistor 120. The bias transistor 120 operates as a constant current supply.

In FIG. 14, the gate electrode of the amplifying transistor 113 serves as an input terminal 131. Therefore an input electric potential Vin is applied to the gate electrode of the amplifying transistor 113. The source region of the amplifying transistor 113 serves as an output terminal 132. Therefore the electric potential of the source region of the amplifying transistor 113 is an output electric potential Vout. The input/output electric potentials of the source follower circuit satisfy Vout=Vin−Vb.

In FIG. 14, it is assumed that the sensor selecting transistor 112 is conductive and the transistor 112 is omitted from the drawing. The electric potential of the n-channel terminal of the photoelectric conversion element 111 corresponds to the input electric potential Vin (the gate electric potential of the amplifying transistor 113). The electric potential of the sensor signal output line (SSi) corresponds to the output electric potential Vout (the source electric potential of the amplifying transistor 113). The sensor power supply line (VBi) corresponds to the amplifier side power supply line 130.

Accordingly, in FIG. 14, the electric potential of the n-channel terminal of the photoelectric conversion element 111 is Vpd, the electric potential of the bias signal line (B.S.) is Vb, and the electric potential of the sensor signal output line (SSi) is Vout. When the power supply reference line 121 and the power supply line 122 have an electric potential of 0 V. Vout=Vpd−Vb. Therefore Vout changes as the electric potential Vpd of the n-channel terminal of the photoelectric conversion element 111 changes, outputting as a signal the change in Vpd. This allows the photoelectric conversion element 111 to read the intensity of light.

Figure 15:
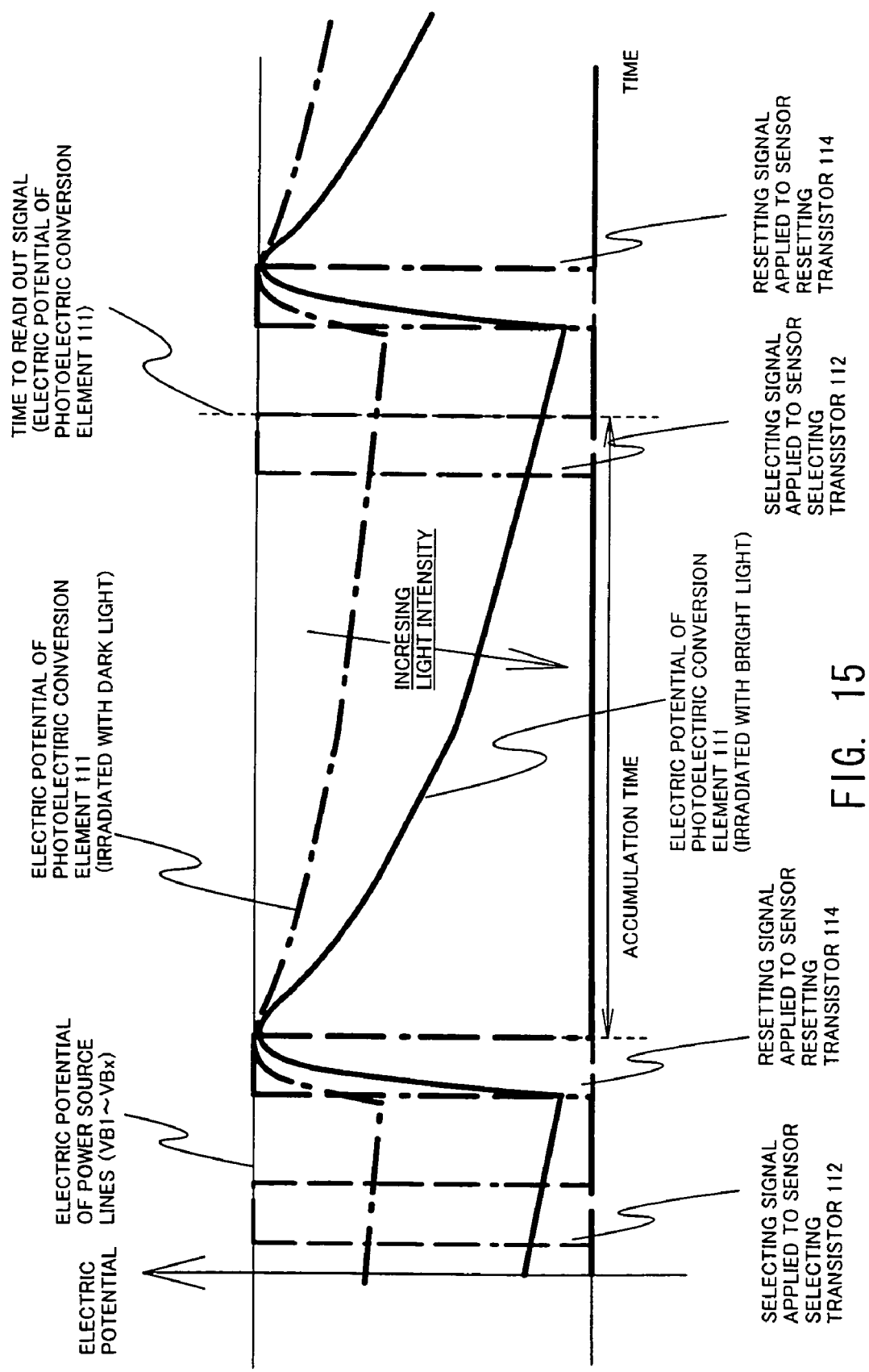
FIG. 15 is a timing chart of signals applied to the pixel portion.

The description given next with reference to the timing chart of FIG. 15 is about signals in the pixel 102.

First, the sensor resetting signal line (one of SR1 to SRy) is controlled to turn the sensor resetting transistor 114 conductive.

Next, the n-channel terminal of the photoelectric conversion element 111 is charged until its electric potential reaches the level of the electric potential of the sensor power supply line (one of VB1 to VBx), namely, the power supply electric potential Vdd. In other words, the pixel 102 is reset. Then the sensor resetting signal line (one of SR1 to SRy) is controlled to turn the sensor resetting transistor 114 unconductive.

Thereafter the photoelectric conversion element 111 generates electric charges in an amount according to the intensity of light if the photoelectric conversion element is irradiated with light. The electric charges charged by reset operation are gradually discharged to lower the electric potential of the n-channel terminal of the photoelectric conversion element 111.

As shown in FIG. 12, when the photoelectric conversion element 111 is irradiated with bright light, a large amount of electric charges are discharged to lower the electric potential of the n-channel terminal of the photoelectric conversion element 111. When the photoelectric conversion element 111 is irradiated with weak light, a small amount of electric charges are discharged and therefore the electric potential of the n-channel terminal of the photoelectric conversion element 111 is lowered less than in the case where the element is irradiated with bright light.

Then at one point, the sensor selecting transistor 112 is turned conductive to read as a signal the electric potential of the n-channel terminal of the photoelectric conversion element 111. The signal is in proportion to the intensity of light that irradiates the photoelectric conversion element 111. The sensor resetting transistor 114 is again turned conductive to reset the photoelectric conversion element 111 and repeat the operations described above.

If the photoelectric conversion element 111 is irradiated with too bright light, a very large amount of electric charges are discharged to greatly lower the electric potential of the n-channel terminal of the photoelectric conversion element 111. However, the electric potential of the n-channel terminal of the photoelectric conversion element 111 is never reduced to a level lower than the electric potential of the p-channel terminal of the photoelectric conversion element 111, namely, the electric potential of the power supply reference line 121.

When the electric potential of the n-channel terminal of the photoelectric conversion element 111 is reduced due to irradiation of very bright light, the electric potential stops lowering once it reaches the level of the electric potential of the power supply reference line 121. This is called saturation. If it reaches the saturation, the electric potential of the n-channel terminal of the photoelectric conversion element 111 no longer changes to make it impossible to output a signal in accordance with the accurate intensity of light. Therefore, for the sake of normal operation, the device has to be operated in the manner that prevents the photoelectric conversion element 111 from reaching saturation.

A period started with reset of the pixel 102 and ends with output of the signal is called an accumulation time. The accumulation time refers to a time in which a light receiving unit of an image sensor is irradiated with light and signals are accumulated, and is also called an exposure time. In the accumulation time, the photoelectric conversion element 111 accumulates electric charges generated from light that irradiates the photoelectric conversion element 111.

Accordingly, when the length of accumulation time differs, the total amount of electric charges generated from light also differs to vary the signal value even if the intensity of light is the same. For example, an intense light irradiating the photoelectric conversion element 111 causes saturation in a short accumulation time. A weak light irradiating the photoelectric conversion element 111 can also cause saturation if the accumulation time is long enough. In other words, the signal value is determined by the product of the intensity of light irradiating the photoelectric conversion element 111 and the length of accumulation time.

This embodiment may be combined freely with Embodiment Modes 1 through 3 and Embodiments 1 through 3.

Embodiment 5

Figure 19:
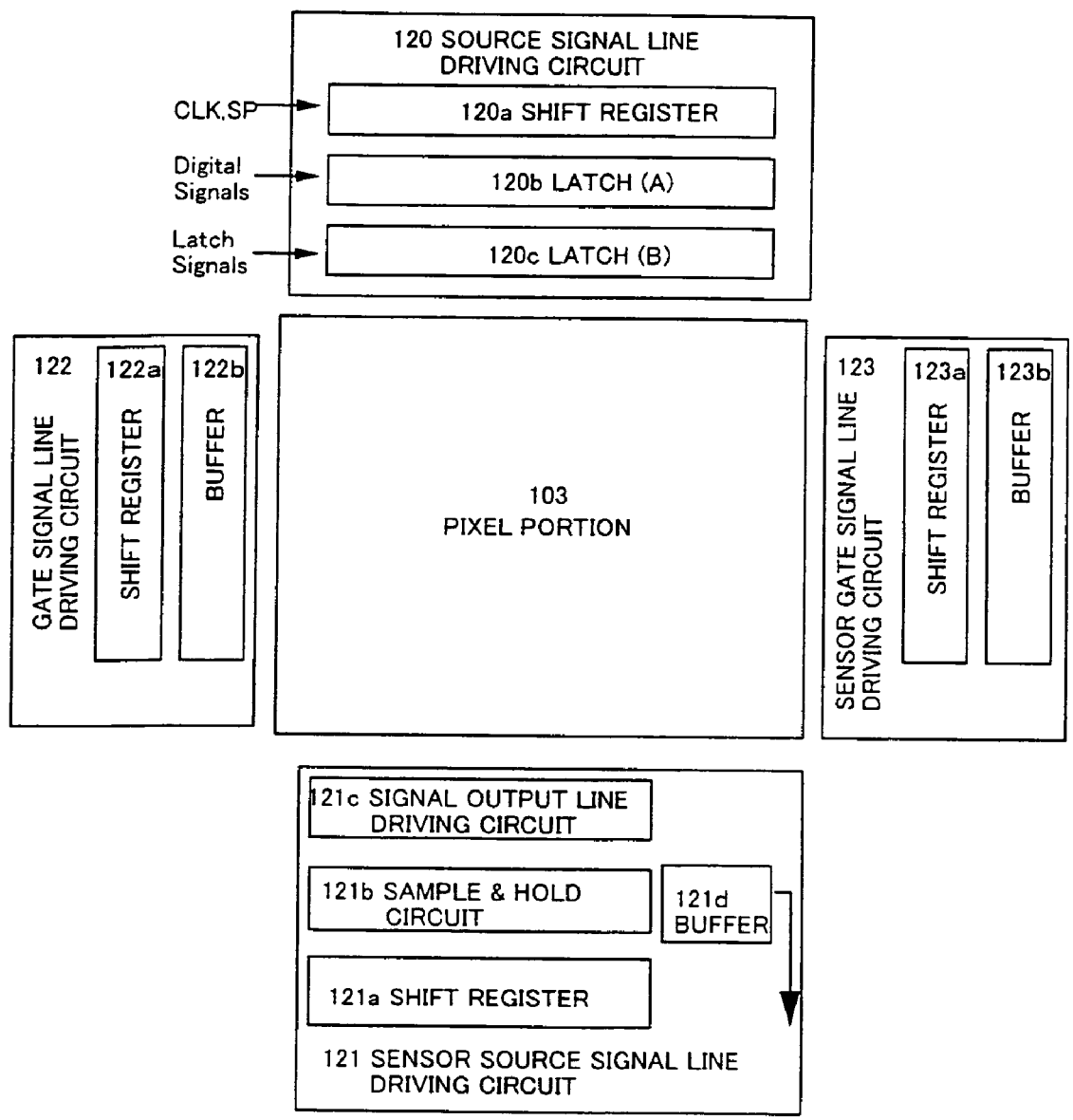
FIG. 19 is a block diagram of a semiconductor device to which the present invention is applied.

This embodiment shows an example of a circuit structure of a semiconductor device according to the present invention with reference to FIG. 19. The semiconductor device described in this embodiment has in one pixel a light emitting element, a photoelectric conversion element, and a plurality of transistors. The semiconductor device of this embodiment has two functions consisting of an image sensor function and a display function.

In this embodiment, the semiconductor device has a source signal line driving circuit 120, a gate signal line driving circuit 122, a pixel portion 103, a sensor source signal line driving circuit 121, and a sensor gate signal line driving circuit 123.

The source signal line driving circuit 120 has a shift register 120a, a latch A 120b, and a latch B 120c. The gate signal line driving circuit 122 has a shift register 122a and a buffer 122b. If necessary, a level shifter circuit may be provided between the sampling circuit and the shift register.

The source signal line driving circuit 120 may have a level shifter and a sampling circuit instead of the latch A 120b and the latch B 120c.

The sensor source signal line driving circuit 121 has a shift register 121a, a sample & hold circuit 121b, a signal output line driving circuit 121c, and a buffer 121d. The sensor gate signal line driving circuit 123 has a shift register 123a and a buffer 123b.

In this embodiment, the pixel portion 103 has a plurality of pixels. Although this embodiment shows the structures of the pixel portion 103 and the driving circuit portion 101 alone, the semiconductor device may further have a memory and a microprocessor.

This embodiment can be combined freely with Embodiment Modes 1 through 3 and Embodiments 1 through 4.

Embodiment 6

In this embodiment, the semiconductor device, in which the light emitting element and the photoelectric conversion element explained in Embodiment 5 and plurality of transistors are provided in one pixel, is described with reference to FIGS. 20 and 21.

A pixel portion 103 source signal lines (S1 to Sx), power supply lines (V1 to Vx), selecting signal lines (EG1 to EGy), resetting signal lines (ER1 to ERy), sensor selecting signal lines (SG1 to SGy), sensor resetting signal lines (SR1 to SRy), sensor signal output lines (SS1 to SSx), and sensor power supply lines (VB1 to VBx).

The pixel portion 103 contains a plurality of pixels 102. Each of the pixels 102 has one of the source signal lines (S1 to Sx), one of the power supply lines (V1 to Vx), one of the selecting signal lines (EG1 to EGy), one of the resetting signal lines (ER1 to ERy), one of the sensor selecting signal lines (SG1 to SGy), one of the sensor resetting signal lines (SR1 to SRy) one of the sensor signal output lines (SS1 to SSx), and one of the sensor power supply lines (VB1 to VBx). Each of the pixels 102 also has a selecting transistor 116, a driving transistor 119, a resetting transistor 117, a sensor selecting transistor 112, an amplifying transistor 113, and a sensor resetting transistor 114.

A bias transistor 120 has a source region and a drain region one of which is connected to the sensor signal output line (one of SS1 to SSx) and the other of which is connected to a power supply line 122. A gate electrode of the bias transistor 120 is connected to a bias signal line (BS).

Figure 20:
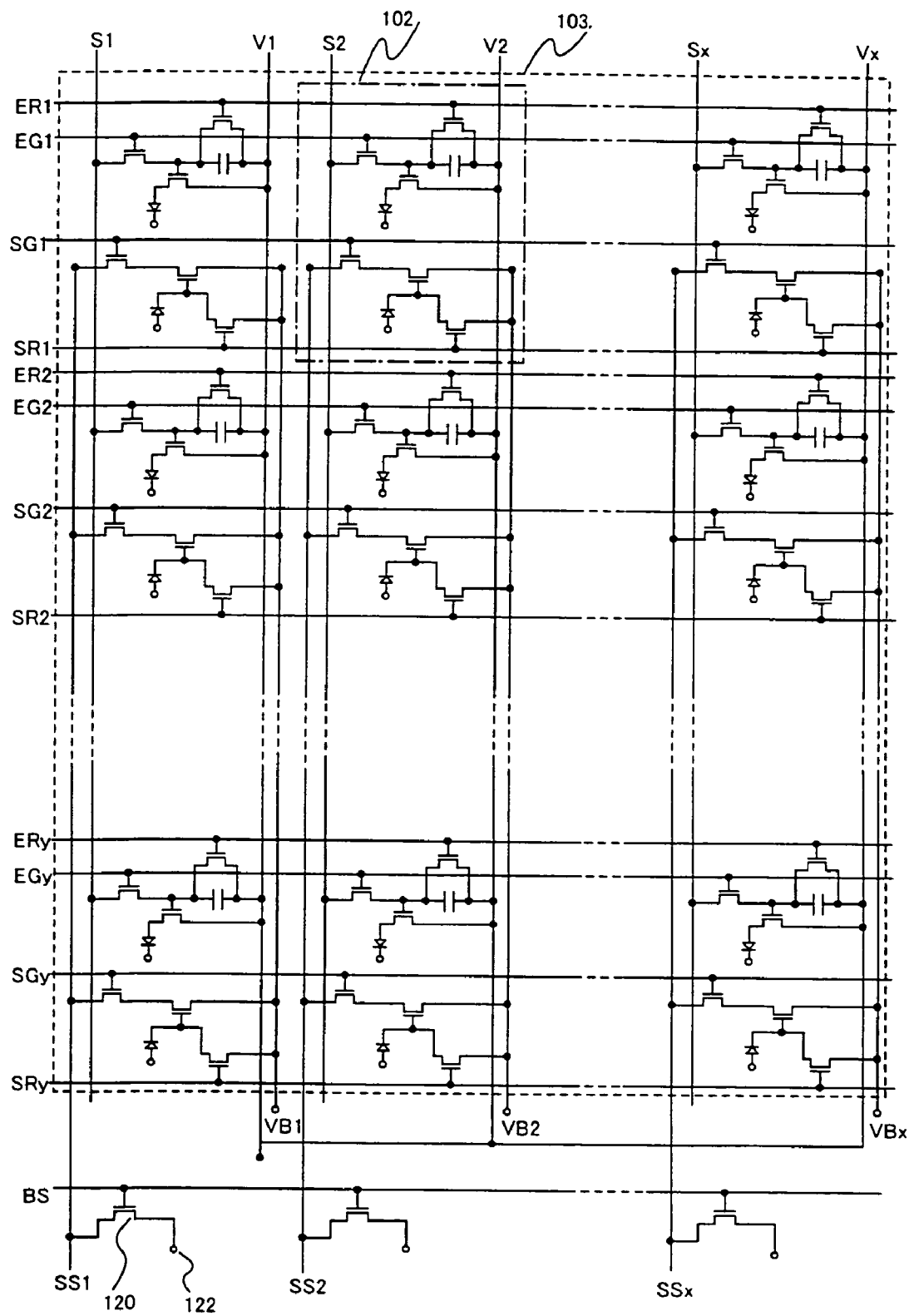
FIG. 20 is a circuit diagram of a semiconductor device to which the present invention is applied.
Figure 21:
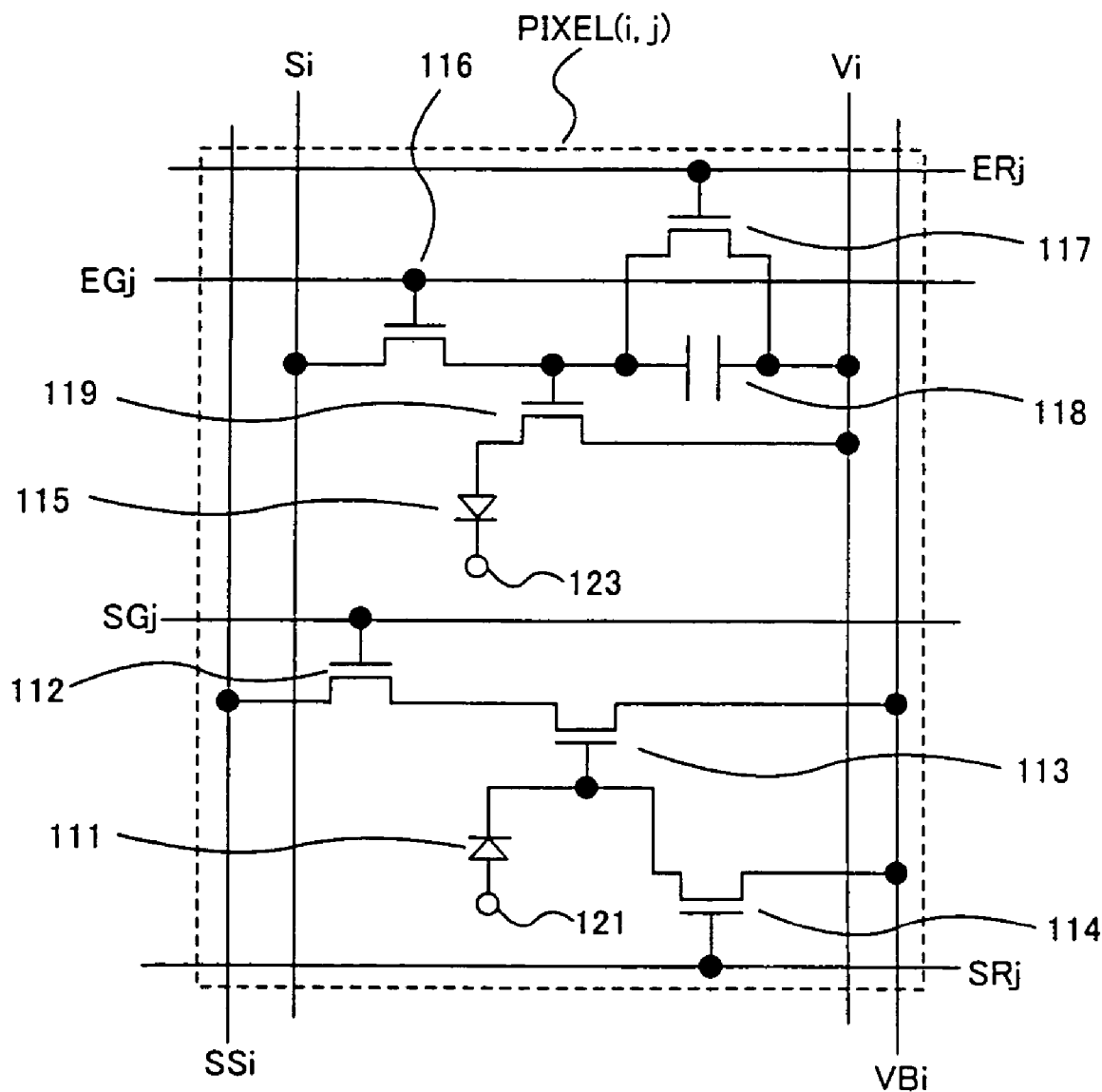
FIG. 21 is a circuit diagram of a semiconductor device to which the present invention is applied.

FIG. 21 shows a pixel (i,j) located at Row i and Column j in the pixel portion of FIG. 20.

The photodiode 111 has an n-channel terminal, a p-channel terminal, and a photoelectric conversion layer that is placed between the n-channel terminal and the p-channel terminal. One of the n-channel terminal and the p-channel terminal is connected to a power supply reference line 121 and the other is connected to a gate electrode of the amplifying transistor 113.

A gate electrode of the sensor selecting transistor 112 is connected to the sensor selecting signal line (SGj). The sensor selecting transistor 112 has a source region and a drain region one of which is connected to a source region of the amplifying transistor 113 and the other of which is connected to the sensor signal output line (SSi). The sensor selecting transistor 112 is a transistor functioning as a switching element when a signal of the photodiode 111 is outputted.

A drain region of the amplifying transistor 113 is connected to the sensor power supply line (VBi). The source region of the amplifying transistor 113 is connected to the source region or drain region of the sensor selecting transistor 112. The amplifying transistor 113 and the bias transistor 120 together make a source follower circuit. Accordingly, it is desirable for the amplifying transistor 113 and the bias transistor 120 to have the same polarity.

A gate electrode of the sensor resetting transistor 114 is connected to the sensor resetting signal line (SRj). The sensor resetting transistor 114 has a source region and a drain region one of which is connected to the sensor power supply line (VBi) and the other of which is connected to the photodiode 111 and to the gate electrode of the amplifying transistor 113. The sensor resetting transistor 114 is a transistor functioning as an element for initializing (resetting) the photodiode 111.

A light emitting element 115 has an anode, a cathode, and an organic compound layer that is placed between the anode and the cathode. When the anode is connected to a source region or drain region of the driving transistor 116, the anode serves as a pixel electrode whereas the cathode serves as an opposite electrode. On the other hand, the cathode serves as the pixel electrode and the anode serves as the opposite electrode when the cathode is connected to the source region or drain region of the driving transistor 116.

A gate electrode of the selecting transistor 116 is connected to the selecting signal line (EGj). The selecting transistor 116 has a source region and a drain region one of which is connected to the source signal line (Si) and the other of which is connected to a gate electrode of the driving transistor 116. The selecting transistor 116 is a transistor functioning as a switching element when a signal is written in the pixel (i,j).

One of the source region and drain region of the driving transistor 116 is connected to the power supply line (Vi) and the other is connected to the light emitting element 115. A capacitor 118 is connected to the gate electrode of the driving transistor 116 and to the power supply line (Vi). The driving transistor 116 is a transistor functioning as a current controlling element, namely, an element for controlling a current supplied to the light emitting element 115.

The resetting transistor 117 has a source region and a drain region one of which is connected to the power supply line (Vi) and the other of which is connected to the gate electrode of the driving transistor 116. A gate electrode of the resetting transistor 117 is connected to the resetting signal line (ERj). The resetting transistor 117 is a transistor functioning as an element for erasing (resetting) a signal written in the pixel (i,j).

The semiconductor device of this embodiment has a plurality of transistors for controlling the photoelectric conversion element and transistors for controlling the light emitting element. Information of a subject read by the photoelectric conversion element is displayed by the light emitting element provided in the same pixel.

This embodiment may be combined freely with Embodiment Modes 1 to 3 and Embodiments 1 to 5.

Embodiment 7

This embodiment describes a sectional structure (before sealing) of the semiconductor device of Embodiments 5 and 6 which has in one pixel a light emitting element, a photoelectric conversion element, and a plurality of transistors. The description is given with reference to FIG. 16. The semiconductor device of this embodiment is manufactured to a point in the same way as the semiconductor device of Embodiment Mode 1. So, for components denoted by the same symbols as those in FIGS. 1A to 3, see Embodiment Mode 1.

Figure 16:
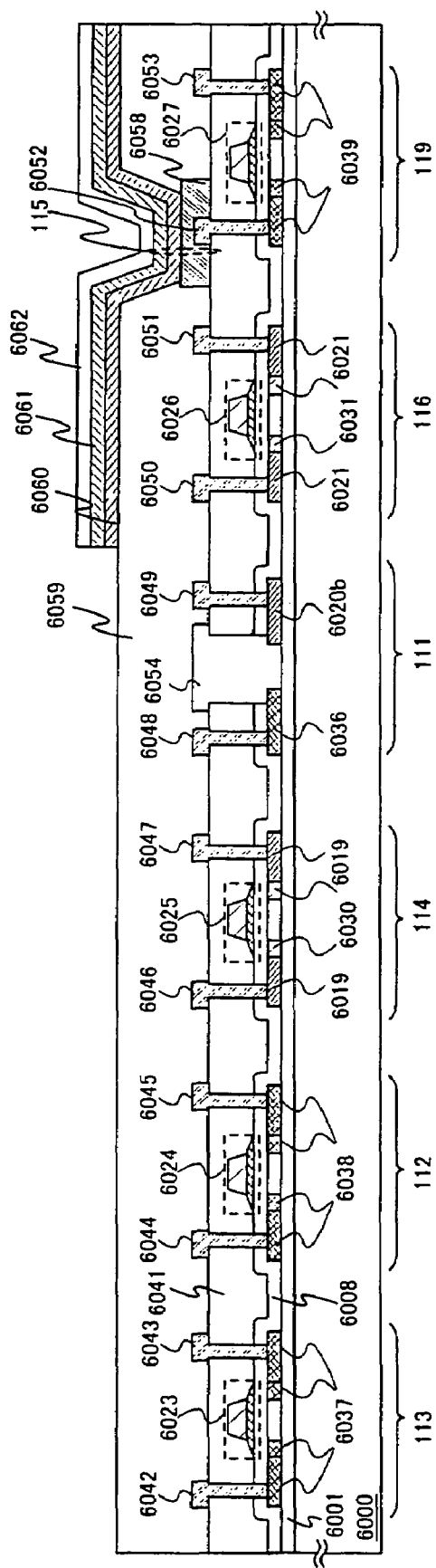
FIG. 16 is a diagram showing a sectional structure of a semiconductor device of the present invention.

In FIG. 16, denoted by 6000 is a substrate having an insulating surface and 6001, a base film. A photoelectric conversion element 111, an amplifying transistor 113, a selecting transistor 112, and a resetting transistor 114 are formed on the base film 6001. Also formed are a light emitting element 115 as well as a switching transistor 116 and a driving transistor 119 which control the light emitting element 115. Each of the transistors may have any known transistor structure.

Next, brief descriptions will be given on the structures of the transistors formed on the substrate 6000 that has an insulating surface. In the amplifying transistor 113, denoted by 6023 is a gate electrode, 6008, a gate insulating film, 6037, a source region and a drain region that are p type impurity regions, 6042, a source wiring line, and 6043, a drain wiring line.

In the selecting transistor 112, denoted by 6024 is a gate electrode, 6008, a gate insulating film, 6038, a source region and a drain region that are p type impurity regions, 6044, a source wiring line, and 6045, a drain wiring line.

In the resetting transistor 114, denoted by 6025 is a gate electrode, 6008, a gate insulating film, 6019, a source region and a drain region that are n type impurity regions, 6046, a source wiring line, and 6047, a drain wiring line.

In the photoelectric conversion element 111, denoted by 6036 is a p type semiconductor layer that is a p type impurity region, 6020*b*, an n type semiconductor layer that is an n type impurity region, and 6054, a photoelectric conversion layer (i layer) that is an amorphous semiconductor film.

In the switching transistor 116, denoted by 6026 is a gate electrode, 6008, a gate insulating film, 6021, a source region and a drain region that are n type impurity regions, 6031, an LDD region (lightly doped drain region), 6050, a source wiring line, and 6051, a drain wiring line.

In the driving transistor 119, denoted by 6027 is a gate electrode, 6008, a gate insulating film, 6039, a source region and a drain region that are p type impurity regions, 6052, a drain wiring line, and 6053, a source wiring line.

An interlayer insulating film 6041 covers the amplifying transistor 113, the selecting transistor 112, the resetting transistor 114, the switching transistor 116, and the driving transistor 119.

The pixel electrode 6058 is placed so as to be in contact with the drain wiring line 6052 of the driving transistor 119. The pixel electrode 6058 functions as an anode of the light emitting element 115, and is formed from a conductive film having a large work function, typically, a conductive oxide film. The conductive oxide film can be formed from indium oxide, tin oxide, zinc oxide, or a compound of these materials.

Reference symbol 6060 denotes an organic compound layer. The organic compound layer 6060 can be formed of any known material. Denoted by 6061 is a cathode of the light emitting element 115, and a conductive film having a small work function is used for the cathode. The conductive film having a small work function is a conductive film that contains an element belonging to Group 1 or 2 in the periodic table.

A laminate consisting of the pixel electrode (anode) 6058, the organic compound layer 6060, and the cathode 6061 is the light emitting element 115. 6062 denotes a protective film (passivation film). The protective film 6062 is a single layer or laminate of insulating films, including a carbon film, a silicon nitride film, and a silicon oxynitride film.

This embodiment may be combined freely with Embodiment Modes 1 through 3 and Embodiments 1 through 6.

Embodiment 8

This embodiment describes a sectional structure (before sealing) of the semiconductor device of Embodiments 5 and 6 which has in one pixel a light emitting element, a photoelectric conversion element, and a plurality of transistors. The description, which is different from Embodiment 7, is given with reference to FIG. 17. The semiconductor device of this embodiment is manufactured to a point in the same way as the semiconductor device of Embodiment Mode 2. Therefore, for components denoted by the same symbols as those in FIGS. 4A to 6, see Embodiment Mode 2.

Figure 17:
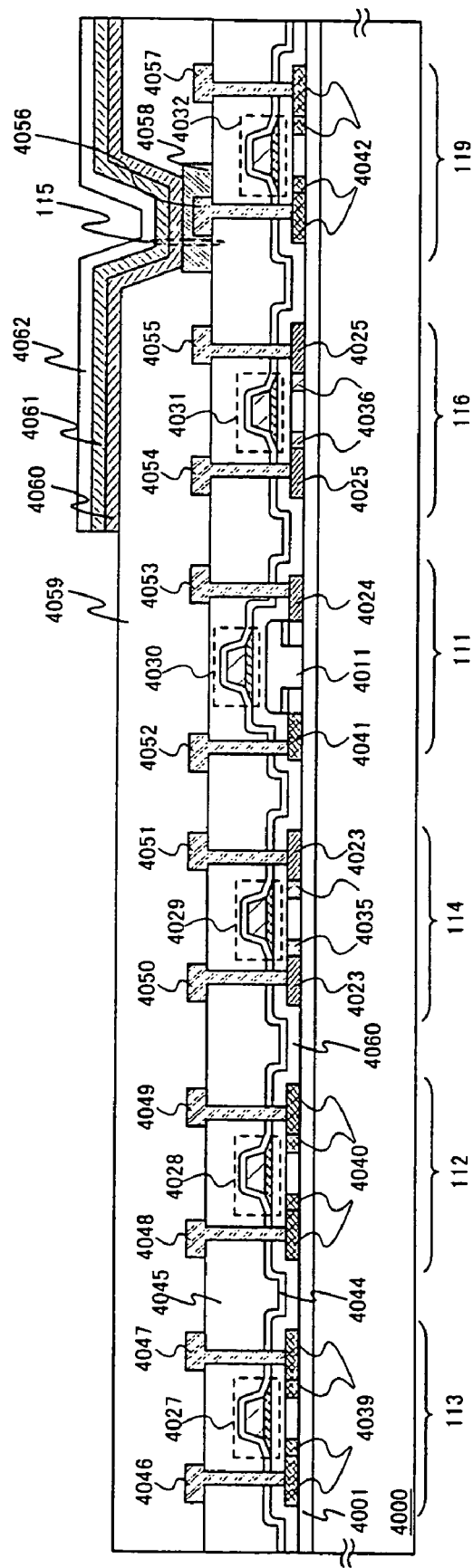
FIG. 17 is a diagram showing a sectional structure of a semiconductor device of the present invention.

In FIG. 17, denoted by 4000 is a substrate having an insulating surface and 4001, a base film. A photoelectric conversion element 111, an amplifying transistor 113, a selecting transistor 112, and a resetting transistor 114 are formed on the base film 4001. Also formed are a light emitting element 115 as well as a switching transistor 116 and a driving transistor 119 which control the light emitting element 115. Each of the transistors may have any known transistor structure. In this embodiment, an example of forming each transistor by top gate type transistors is described. However, each transistor may also be formed by bottom gate type transistors.

Next, brief descriptions will be given on the structures of the transistors formed on the substrate 4000 that has an insulating surface. In the amplifying transistor 113, denoted by 4027 is a gate electrode, 4060, a gate insulating film, 4039, a source region and a drain region that are p-type impurity regions, 4046, a source wiring line, and 4047, a drain wiring line.

In the selecting transistor 112, denoted by 4028 is a gate electrode, 4060, a gate insulating film, 4040, a source region and a drain region that are p-type impurity regions, 4048, a source wiring line, and 4049, a drain wiring line.

In the resetting transistor 114, denoted by 4029 is a gate electrode, 4060, a gate insulating film, 4023, a source region and a drain region that are n-type impurity regions, 4035, an LDD region (lightly doped drain region), 4050, a source wiring line, and 4051, a drain wiring line.

In the photoelectric conversion element 111, denoted by 4041 is a p-type semiconductor layer that is a p-type impurity region, 4024, an n-type semiconductor layer that is an n-type impurity region, and 4011, a photoelectric conversion layer (i layer) that is an amorphous semiconductor film.

In the switching transistor 116, denoted by 4031 is a gate electrode, 4060, a gate insulating film, 4025, a source region and a drain region that are n-type impurity regions, 4036, an LDD region (lightly doped drain region), 4054, a source wiring line, and 4055, a drain wiring line.

In the driving transistor 119, denoted by 4032 is a gate electrode, 4060, a gate insulating film, 4042, a source region and a drain region that are p-type impurity regions, 4056, a drain wiring line, and 4057, a source wiring line.

An interlayer insulating films 4044 and 4045 covers the amplifying transistor 113, the selecting transistor 112, the resetting transistor 114, the switching transistor 116, and the driving transistor 119.

The pixel electrode 4058 is placed so as to be in contact with the drain wiring line 4056 of the driving transistor 119. The pixel electrode 4058 functions as an anode of the light emitting element 115, and is formed from a conductive film having a large work function, typically, a conductive oxide film. The conductive oxide film can be formed from indium oxide, tin oxide, zinc oxide, or a compound of these materials.

Reference symbol 4060 denotes an organic compound layer. The organic compound layer 4060 can be formed of any known material. Denoted by 4061 is a cathode of the light emitting element 115, and a conductive film having a small work function is used for the cathode. The conductive film having a small work function is a conductive film that contains an element belonging to Group 1 or 2 in the periodic table.

A laminate consisting of the pixel electrode (anode) 4058, the organic compound layer 4060, and the cathode 4061 is the light emitting element 115. 4062 denotes a protective film (passivation film). The protective film 4062 is a single, layer or laminate of insulating films, including a carbon film, a silicon nitride film, and a silicon oxynitride film.

This embodiment may be combined freely with Embodiment Modes 1 through 3 and Embodiments 1 through 7.

Embodiment 9

This embodiment describes a sectional structure (before sealing) of the semiconductor device of Embodiments 5 and 6 which has in one pixel a light emitting element, a photoelectric conversion element, and a plurality of transistors. The description, which is different from Embodiments 8 and 9, is given with reference to FIG. 18. The semiconductor device of this embodiment is manufactured to a point in the same way as the semiconductor device of Embodiment Mode 3. Therefore, for components denoted by the same symbols as those in FIGS. 7A to 9, see Embodiment Mode 3.

Figure 18:
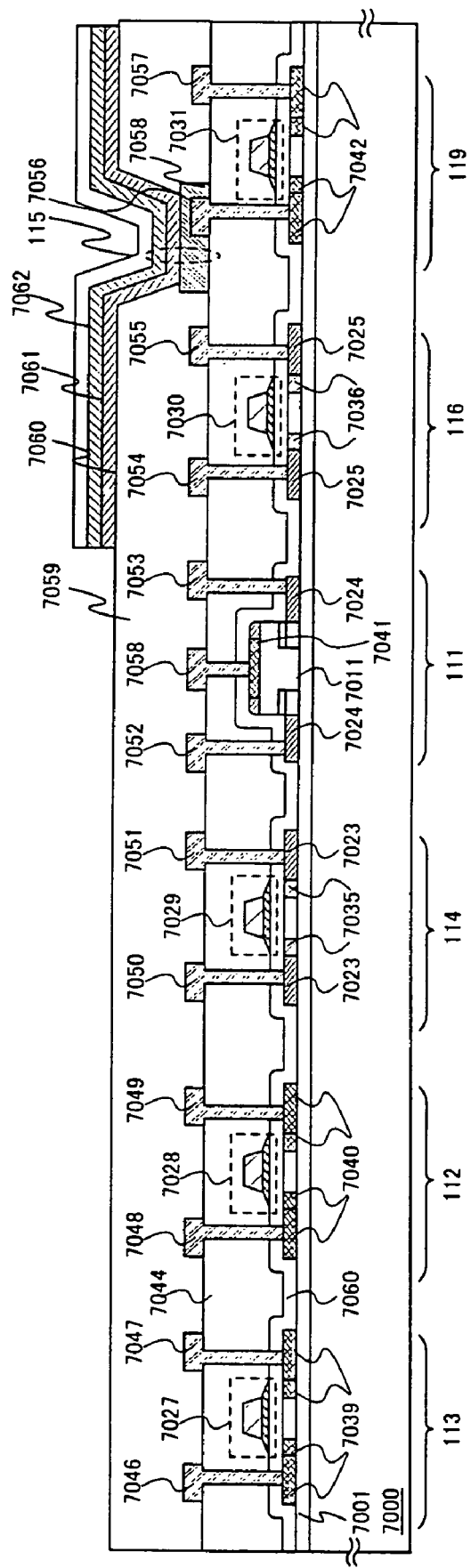
FIG. 18 is a diagram showing a sectional structure of a semiconductor device of the present invention.

In FIG. 18, denoted by 7000 is a substrate having an insulating surface and 7001, a base film. A photoelectric conversion element 111, an amplifying transistor 113, a selecting transistor 112, and a resetting transistor 114 are formed on the base film 7001. Also formed are a light emitting element 115 as well as a switching transistor 116 and a driving transistor 119 which control the light emitting element 115. Each of the transistors may have any known transistor structure. In this embodiment, an example of forming each transistor by top gate type transistors is described. However, each transistor may also be formed by bottom gate type transistors.

Next, brief descriptions will be given on the structures of the transistors formed on the substrate 7000 that has an insulating surface. In the amplifying transistor 113, denoted by 7027 is a gate electrode, 7060, a gate insulating film, 7039, a source region and a drain region that are p-type impurity regions, 7046, a source wiring line, and 7047, a drain wiring line.

In the selecting transistor 112, denoted by 7028 is a gate electrode, 7060, a gate insulating film, 7040, a source region and a drain region that are p-type impurity regions, 7048, a source wiring line, and 7049, a drain wiring line.

In the resetting transistor 114, denoted by 7029 is a gate electrode, 7060, a gate insulating film, 7023, a source region and a drain region that are n-type impurity regions, 7035, an LDD region (lightly doped drain region), 7050, a source wiring line, and 7051, a drain wiring line.

In the photoelectric conversion element 111, denoted by 7041 is a p-type semiconductor layer that is a p-type impurity region, 7024, an n-type semiconductor layer that is an n-type impurity region, and 7011, a photoelectric conversion layer (i layer) that is an amorphous semiconductor film.

In the switching transistor 116, denoted by 7030 is a gate electrode, 7060, a gate insulating film, 7025, a source region and a drain region that are n-type impurity regions, 7036, an LDD region (lightly doped drain region), 7054, a source wiring line, and 7055, a drain wiring line.

In the driving transistor 119, denoted by 703 1 is a gate electrode, 7060, a gate insulating film, 7042, a source region and a drain region that are p-type impurity regions, 7058, a drain wiring line, and 7057, a source wiring line.

An interlayer insulating film 7044 covers the amplifying transistor 113, the selecting transistor 112, the resetting transistor 114, the switching transistor 116, and the driving transistor 119.

The pixel electrode 7058 is placed so as to be in contact with the drain wiring line 7056 of the driving transistor 119. The pixel electrode 7058 functions as an anode of the light emitting element 115, and is formed from a conductive film having a large work function, typically, a conductive oxide film. The conductive oxide film can be formed from indium oxide, tin oxide, zinc oxide, or a compound of these materials.

Reference symbol 7060 denotes an organic compound layer. The organic compound layer 7060 can be formed of any known material. Denoted by 7061 is a cathode of the light emitting element 115, and a conductive film having a small work function is used for the cathode. The conductive film having a small work function is a conductive film that contains an element belonging to Group 1 or 2 in the periodic table.

A laminate consisting of the pixel electrode (anode) 7058, the organic compound layer 7060, and the cathode 7061 is the light emitting element 115. 7062 denotes a protective film (passivation film). The protective film 7062 is a single layer or laminate of insulating films, including a carbon film, a silicon nitride film, and a silicon oxynitride film.

This embodiment may be combined freely with Embodiment Modes 1 through 3 and Embodiments 1 through 8.

Embodiment 10

In this embodiment, the external of the semiconductor device of the present invention is described with reference to FIGS. 22 and 23. In this embodiment, an example of the semiconductor device is shown, in which the light emitting element, the photoelectric conversion element and plurality of transistors are formed on the insulating surface substrate explained in Embodiments 5 to 9.

Figure 22:
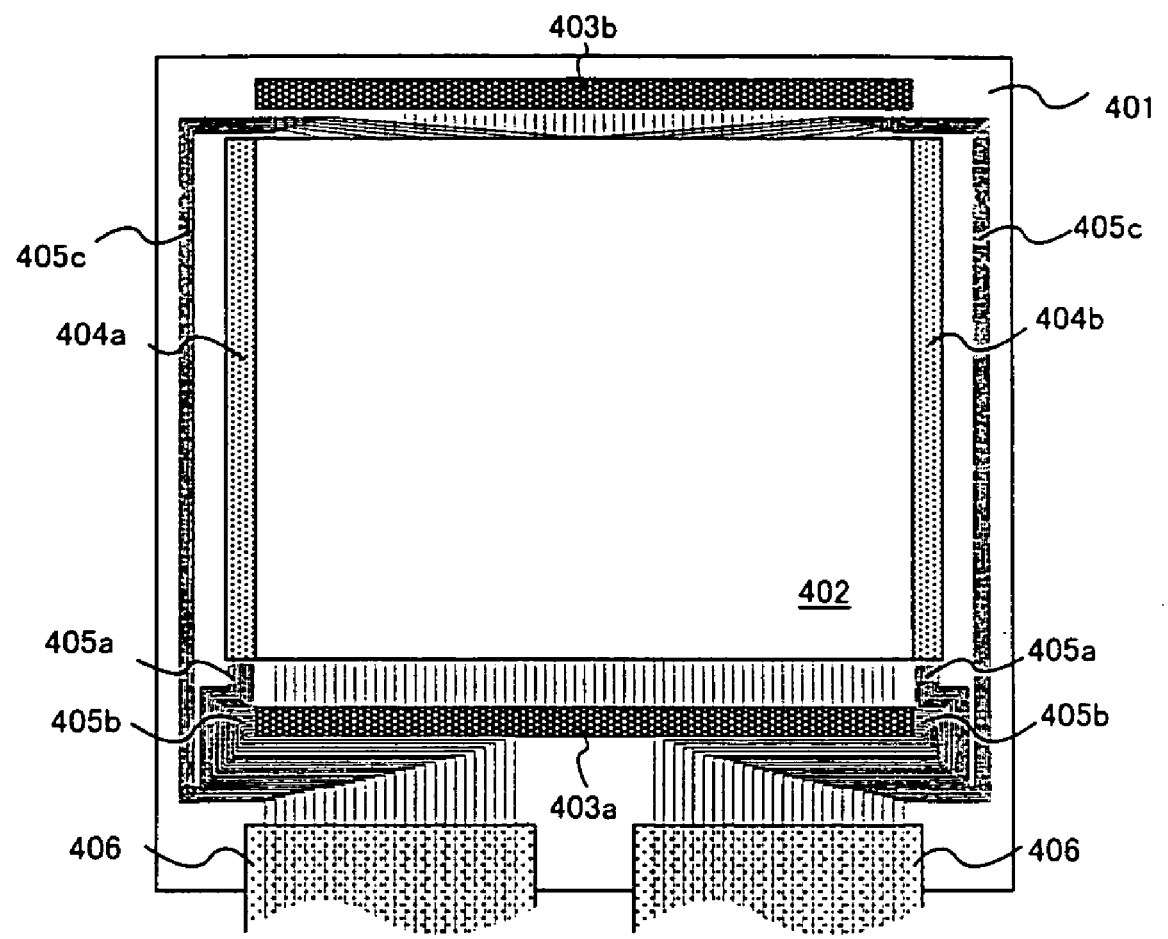
FIG. 22 is a diagram showing the exterior of a semiconductor device of the present invention.

FIG. 22 is a top view of TFT of the semiconductor device of the present invention. In this embodiment, TFT substrate means a substrate provided with a pixel portion.

On the substrate 401, the pixel portion 402, the sensor source signal driving circuit 403a, the light emitting source signal driving circuit 403b, the light emitting gate signal driving circuit 404a, and the sensor gate signal driving circuit 404b are provided. The designer can properly set the number of source signal driving circuit and the gate signal driving circuit. The source signal driving circuit and the gate signal driving circuit are provided on the TFT substrate. However, the present invention is not limited to this structure. The source signal driving circuit and the gate signal driving circuit, which are provided on another substrate than TFT substrate, can be electrically connected to the pixel portion by FPC etc.

405c is a drawn wiring connected to the power supply line (not shown in figures) provided in the pixel portion 402. 405a is also a gate drawn wiring connected to the gate signal driving circuits 404a and 404b for sensor and light emitting element. Further, 405b is a source drawn writing connected to the source signal driving circuit 403 for light emitting element.

The gate drawn wiring 405a and the source drawn wiring 405b are connected to IC and the like provided outside of the substrate 401 through FPC 406. The drawn wiring 405c is connected to the power source provided outside of the substrate 401 through FPC 406.

Figure 23A:
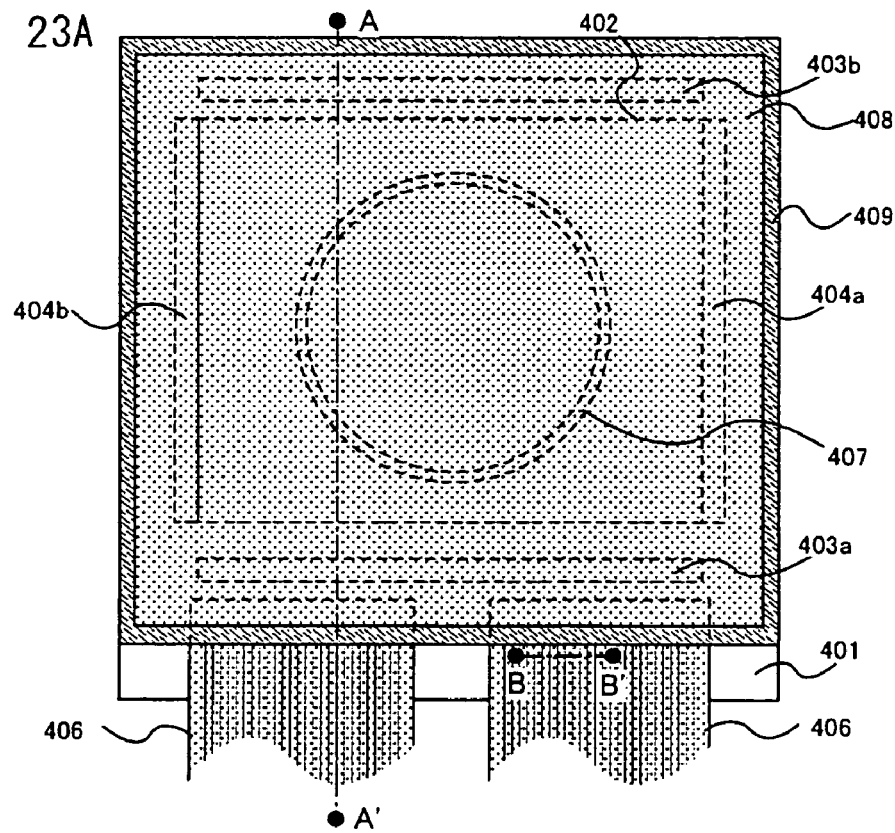
FIG. 23A is a top view of a semiconductor device of the present invention and FIGS. 23B and 23C are sectional views thereof.
Figure 23B:
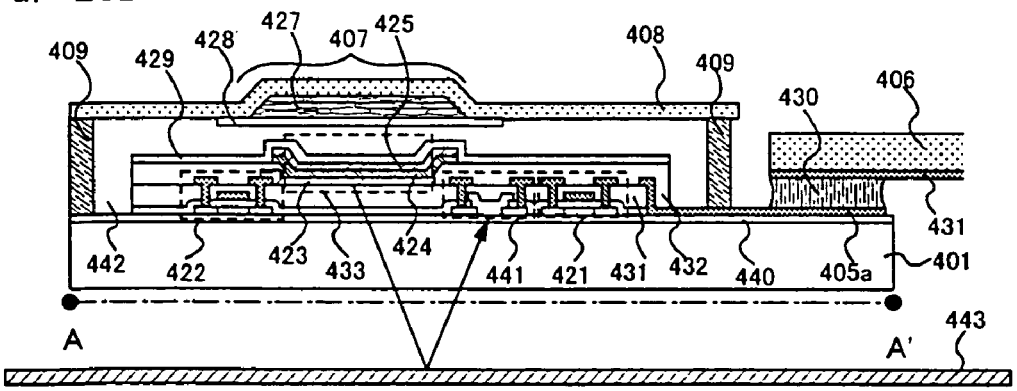
Figure 23C:
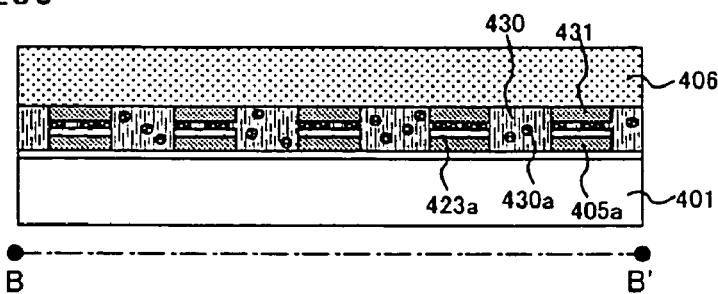

FIG. 22 is a top view of the area sensor which is formed according as the TFT substrate is sealed by sealing materials, FIG. 23B is a cross sectional view taken along with a line A-A' of FIG. 23A, and FIG. 23C is a cross sectional view taken along with a line B-B' of FIG. 23A. The figure shown in FIG. 22 is indicated with the same symbols.

A seal member 409 is provided so as to surround a pixel portion 402, a source signal driving circuits 403a and 403b for a sensor and a light emitting element, and a gate signal driving circuits 404a and 404b for a sensor and a light emitting, which are provided on a substrate 401. Further, a sealing material 408 is provided on the pixel portion 402, a source signal driving circuits 403a and 403b for a sensor and a light emitting element, and a gate signal driving circuits 404a and 404b for a sensor and a light emitting. Thus, the pixel portion 402, the source signal driving circuits 403a and 403b for a sensor and a light emitting, and the first, the second signal driving circuits 404a and 404b are sealed by the substrate 401, the seal member 409 and the sealing material 408 together with a filler 442.

Further, the pixel portion 402, the source signal driving circuits 403a and 403b, and the gate signal driving circuits 404a and 404b for a sensor and a light emitting, which are provided on the substrate 401, have a plurality of TFTs. In FIG. 23B, a driving TFT 421 included in the source signal driving circuit 403, a driving TFT (TFT controlling current to the light emitting element) 422 included in the pixel portion 402, and a photodiode 441, which are formed on a base film 440, are typically shown.

In this embodiment, the p-channel TFT or the n-channel TFT manufactured by a known method is used as the driving TFT 421, and the p-channel TFT manufactured by a known method is used as the driving TFT 422. Further, the pixel portion 402 is provided with a storage capacitor (not shown) connected to a gate of the driving TFT 422.

An interlayer insulating film (leveling film) 431 is formed on the driving TFT 421 and the driving TFT 422, and a pixel electrode (anode) 423 electrically connected to a drain of the driving TFT 422 is formed thereon. A transparent conductive film having a large work function is used for the pixel electrode 423. A compound of indium oxide and tin oxide, a compound of indium oxide and zinc oxide, zinc oxide, tin oxide or indium oxide can be used for the transparent conductive film. The above transparent conductive film added with gallium may also be used.

Then, an insulating film 432 is formed on the pixel electrode 423, and the insulating film 432 is formed with an opening portion on the pixel electrode 423. In this opening portion, an organic light emitting layer 424 is formed on the pixel electrode 423. A known organic light emitting material or inorganic light emitting material may be used for the organic light emitting layer 424. Further, there exist a low molecular weight (monomer) material and a high molecular weight (polymer) material as the organic light emitting materials, and both the materials may be used.

A known evaporation technique or application technique may be used as a method of forming the organic compound layer 424. Further, the structure of the organic compound layer may take a lamination structure or a single layer structure by freely combining a hole injecting layer, a hole transporting layer, a light emitting layer, an electron transporting layer and an electron injecting layer.

A cathode 425 made of a conductive film having light shielding property (typically, conductive film containing aluminum, copper or silver as its main constituent or lamination film of the above conductive film and another conductive film) is formed on the organic compound layer 424. Further, it is desirable that moisture and oxygen that exist on an interface of the cathode 425 and the organic compound layer 424 are removed as much as possible. Therefore, such a device is necessary that the organic compound layer 424 is formed in a nitrogen or rare gas atmosphere, and then, the cathode 425 is formed without exposure to oxygen and moisture. In this embodiment, the above-described film deposition is enabled by using a multi-chamber type (cluster tool type) film forming device. In addition, a predetermined voltage is given to the cathode 425.

As described above, a light emitting element 433 constituted of the pixel electrode (anode) 423, the organic light emitting layer 424 and the cathode 425 is formed. Further, a protective film 429 is formed on the insulating film 432 so as to cover the light emitting element 433. The protective film 429 is effective in preventing oxygen, moisture and the like from permeating the light emitting element 433.

Reference numeral 405a denotes a drawn wiring to be connected to the power supply line, and the wiring 405a is electrically connected to a source region of the driving TFT 422. The drawn wiring 405a passes between the seal member 409 and the substrate 401, and is electrically connected to an FPC wiring 431 of an FPC 406 through an anisotropic conductive film 430.

A glass material, a metal material (typically, stainless material), a ceramics material or a plastic material (including a plastic film) can be used for the sealing material 408. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the light emitting element is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 442, so that PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

Moreover, a concave portion 407 is provided on the surface of the sealing material 408 on the substrate 401 side, and a hygroscopic substance or a substance that can absorb oxygen 427 is arranged therein in order that the filler 442 is made to be exposed to the hygroscopic substance (preferably, barium oxide) or the substance that can absorb oxygen. Then, the hygroscopic substance or the substance that can absorb oxygen 427 is held in the concave portion 407 by a concave portion cover member 428 such that the hygroscopic substance or the substance that can absorb oxygen 427 is not scattered. Note that the concave portion cover member 428 has a fine mesh form, and has a structure in which air and moisture are penetrated while the hygroscopic substance or the substance that can absorb oxygen 427 is not penetrated. The deterioration of the light emitting element 433 can be suppressed by providing the hygroscopic substance or the substance that can absorb oxygen 427.

As shown in FIG. 23C, the pixel electrode 423 is formed, and at the same time, a conductive film 423*a* is formed so as to contact the drawn wiring 405*a*.

Further, the anisotropic conductive film 430 has conductive filler 430*a*. The conductive film 423*a* on the substrate 401 and the FPC wiring 431 on the FPC 406 are electrically connected to each other by the conductive filler 430*a* by heat-pressing the substrate 401 and the FPC 406.

Note that this embodiment can be implemented by being freely combined with Embodiments Modes 1 to 3, and Embodiments 1 to 9.

Embodiment 11

Examples of electronic equipment using a semiconductor device of the present invention are described with reference to FIGS. 24A to 24D.

Figure 24A:
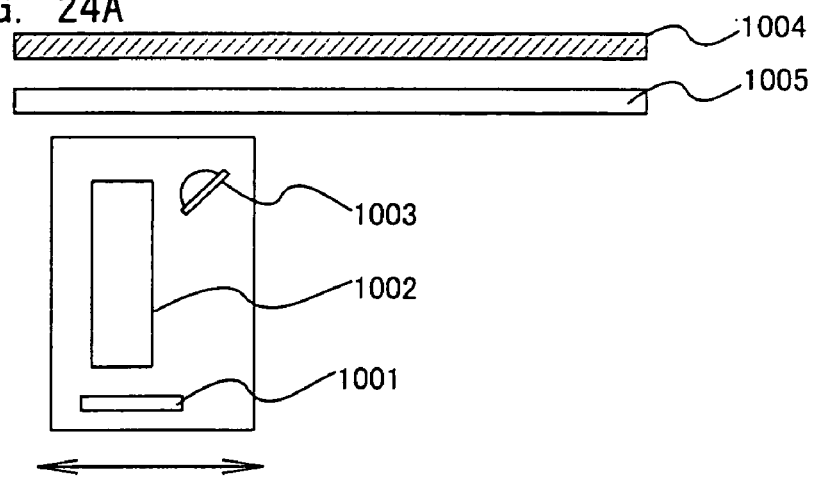
FIGS. 24A to 24D are diagrams showing examples of electronic equipment to which the present invention is applied.

FIG. 24A shows a hand scanner using a line sensor. An optical system 1002 such as a rod lens array is provided above a CCD type (CMOS type) image sensor 1001. The optical system 1002 is used to project an image of a subject 1004 onto the image sensor 1001.

A light source 1003 such as an LED or fluorescent is positioned so as to irradiate the subject 1004 with light. Glass 1005 is placed under the subject 1004.

Light emitted from the light source 1003 enters the subject 1004 through the glass 1005. The light reflected by the subject 1004 enters the optical system 1002 through the glass 1005. After entering the optical system 1002, the light enters the image sensor 1001 to be subjected to photoelectric conversion in there.

Figure 24B:
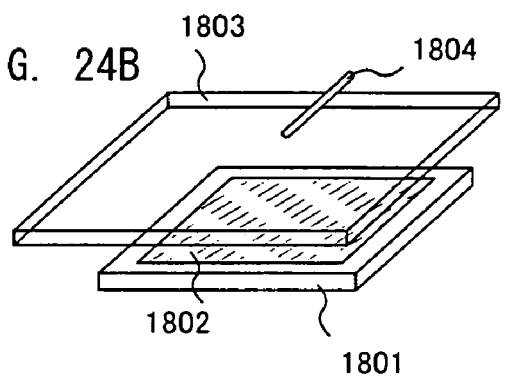

In FIG. 24B, 1801 denotes a substrate; 1802, a pixel portion; 1803, a touch panel; and 1804, a touch pen. The touch panel 1803 is light-transmissive and transmits light emitted from the pixel portion 1802 as well as light entering the pixel portion 1802. The device thus can read an image of a subject through the touch panel 1803. An image on the pixel portion 1802 can be seen through the touch panel 1803 while the pixel portion 1802 is displaying an image.

When the touch pen 1804 comes into contact with the touch panel 1803, the positional information of the point where the touch pen 1804 is in contact with the touch panel 1803 can be sent as an electric signal to the semiconductor device. Any known touch panel and touch pen may be used as the touch panel 1803 and the touch pen 1804 of this embodiment as long as the touch panel is light-transmissive and the positional information of the point where the touch pen is in contact with the touch panel is sent as an electric signal to the semiconductor device.

The semiconductor device structured as above in accordance with the present invention reads information of an image to display the read image in the pixel portion 1802, and allows a user to write or draw on the displayed image with the touch pen 1804. In the semiconductor device of the present invention, the pixel portion 1802 handles all of reading an image, displaying the image, and writing or drawing on the image. Accordingly, it is possible for the semiconductor device to reduce its size and have various functions.

Figure 24C:
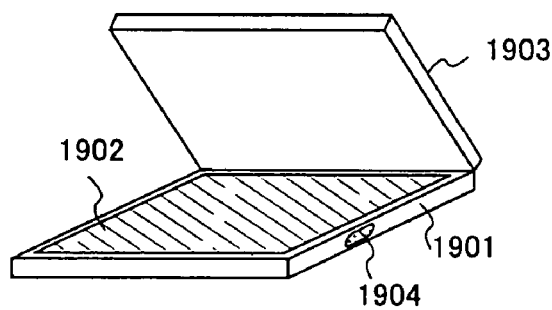
Figure 24D:
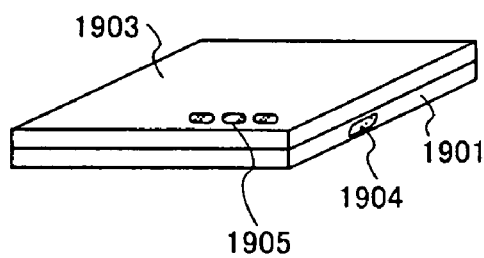

FIG. 24C shows a portable hand scanner different from the one in FIG. 24B. The scanner in FIG.24C is composed of a main body 1901, a pixel portion 1902, a top cover 1903, an external connection port 1904, and operation switches 1905. FIG. 24D shows the same portable hand scanner as the one in FIG. 24C with the top cover 1903 closed.

The semiconductor device of the present invention can display information of a read image in the pixel portion 1902 to allow a user to immediately confirm the image read without adding a display to the semiconductor device.

An image signal read by the pixel portion 1902 may be sent to electronic equipment externally connected to the portable hand scanner through the external connection port 1904. Then the data can be processed in a personal computer to correct, synthesize, or edit the image.

This embodiment may be combined freely with Embodiment Modes 1 to 3 and Embodiments 1 to 10.

Embodiment 12

The following can be given as examples of electronic apparatuses using the semiconductor device of the present invention: a video camera; a digital camera; a laptop computer; a portable information terminal (such as a mobile computer, a mobile telephone, a mobile game equipment or an electronic book).

Figure 25A:
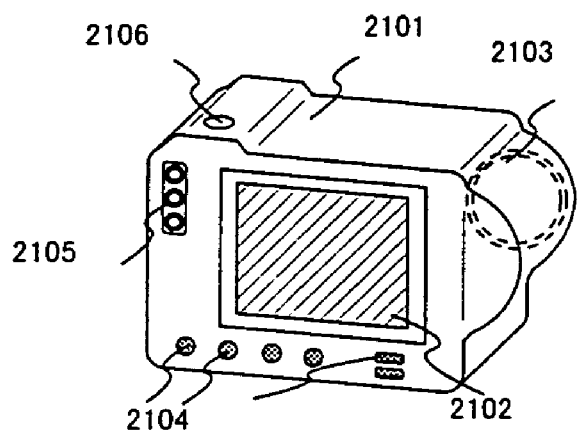
FIGS. 25A to 25C are diagrams showing examples of electronic equipment to which the present invention is applied.

FIG. 25A illustrates a video camera which includes a main body 2101, a display device 2102, an image receiving portion 2103, an operation key 2104, an external connection port 2105, a shutter 2106, and so forth. The semiconductor device of the present invention can be used to the display portion 2102.

Figure 25B:
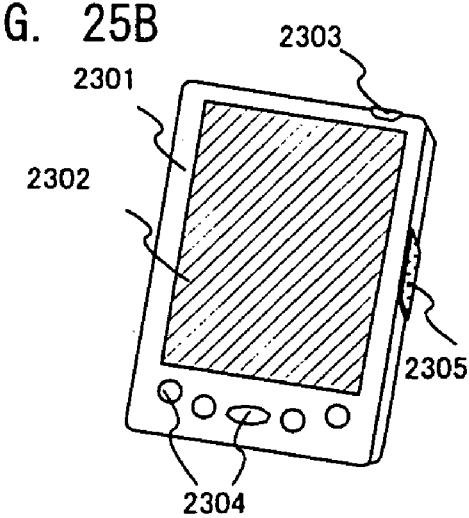

FIG. 25B illustrates a mobile computer which includes a main body 2301, a display portion 2302, a switch 2303, an operation key 2304, an infrared port 2305, and so forth. The semiconductor device of the present invention can be used to the display portion 2302.

Figure 25C:
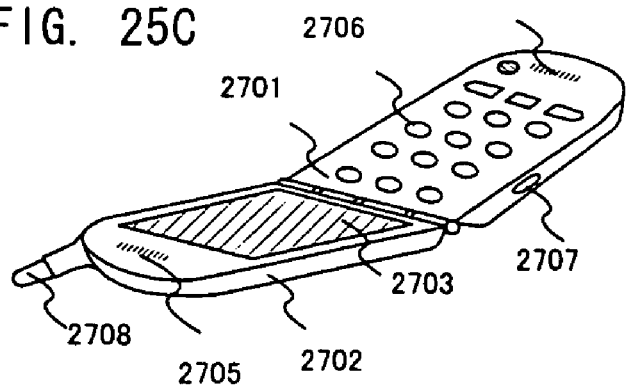

FIG. 25C illustrates a mobile telephone which includes a main body 2701, a casing 2702, a display portion 2703, a sound input portion 2704, a sound output portion 2705, an operation key 2706, an external connection port 2707, an antenna 2708, and so forth. The semiconductor device of the present invention can be used to the display device 2703.

Therefore, the application range of the present invention is so large that the present invention can be applied to various areas' electronic apparatuses.

The present invention can reduce the number of masks used in a semiconductor device manufacturing process for forming a photoelectric conversion element and a transistor on an insulating surface. The manufacturing process therefore can be simplified. As a result, the yield is improved and manufacturing cost can be lowered.

What is claimed is:

1. A method of manufacturing a semiconductor device comprising:
   forming a first semiconductor layer and a second semiconductor layer on an insulating surface;
   forming an insulating film over the first semiconductor layer and the second semiconductor layer;
   forming a contact hole in the insulating film; and
   forming a photoelectric conversion layer over the insulating film so as to be in contact with the first semiconductor layer and the second semiconductor layer through the contact hole,
   wherein a conductivity of the first semiconductor layer is opposite to that of the second semiconductor layer.

2. The method according to claim 1, wherein the conductivity of the first semiconductor layer is n-type and the conductivity of the second semiconductor layer is p-type.

3. The method according to claim 1 wherein each of the first semiconductor layer and the second semiconductor layer is a crystalline semiconductor layer.

4. The method according to claim 1, wherein the photoelectric conversion layer is an amorphous semiconductor layer.

5. The method according to claim 1, wherein the semiconductor device is an electronic equipment selected from the group consisting of a video camera, a digital camera, a laptop computer, a portable information terminal, a mobile computer, a mobile telephone, a mobile game equipment, and an electronic book.

6. A method of manufacturing a semiconductor device comprising:
   forming a first semiconductor layer and a second semiconductor layer on an insulating surface;
   forming an insulating film over the first semiconductor layer and the second semiconductor layer;
   forming a photoelectric conversion layer between the first semiconductor layer and the second semiconductor layer so as to be in contact with the first semiconductor layer and the second semiconductor layer,
   wherein a conductivity of the first semiconductor layer is opposite to that of the second semiconductor layer,
   wherein each of the first semiconductor layer and the second semiconductor layer is a crystalline semiconductor layer, and
   wherein the photoelectric conversion layer is an amorphous semiconductor layer.

7. The method according to claim 6, wherein the conductivity of the first semiconductor layer is n-type and the conductivity of the second semiconductor layer is p-type.

8. The method according to claim 6, wherein the semiconductor device is an electronic equipment selected from the group consisting of a video camera, a digital camera, a laptop computer, a portable information terminal, a mobile computer, a mobile telephone, a mobile game equipment, and an electronic book.

9. The method according to claim 6, wherein the photoelectric conversion layer is formed over the insulating film.

* * * * *